(12) United States Patent
Tseng et al.

(10) Patent No.: US 11,916,100 B2
(45) Date of Patent: Feb. 27, 2024

(54) MULTI-LAYER TRENCH CAPACITOR STRUCTURE

(71) Applicant: Taiwan Semiconductor Manufacturing Company, Ltd., Hsinchu (TW)

(72) Inventors: Hsuan-Han Tseng, Tainan (TW); Chun-Yuan Chen, Tainan (TW); Lu-Sheng Chou, Tainan (TW); Hsiao-Hui Tseng, Tainan (TW); Ching-Chun Wang, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 51 days.

(21) Appl. No.: 17/699,649

(22) Filed: Mar. 21, 2022

(65) Prior Publication Data
US 2023/0032620 A1    Feb. 2, 2023

Related U.S. Application Data

(60) Provisional application No. 63/228,294, filed on Aug. 2, 2021.

(51) Int. Cl.
*H01L 29/94*    (2006.01)
*H01L 27/07*    (2006.01)
*H01L 49/02*    (2006.01)

(52) U.S. Cl.
CPC .......... *H01L 28/75* (2013.01); *H01L 27/0733* (2013.01); *H01L 28/91* (2013.01); *H01L 28/92* (2013.01); *H01L 29/945* (2013.01)

(58) Field of Classification Search
CPC ...... H10B 12/30; H10B 12/315; H10B 12/37; H10B 12/0387; H01L 28/90–92;
(Continued)

(56) References Cited

U.S. PATENT DOCUMENTS

| 4,827,323 A * | 5/1989 | Tigelaar | H10B 12/03 257/E21.613 |
| 2013/0181326 A1 * | 7/2013 | Cheng | H01L 28/91 438/387 |

(Continued)

FOREIGN PATENT DOCUMENTS

TW        201933641 A    8/2019

*Primary Examiner* — Jose R Diaz
(74) *Attorney, Agent, or Firm* — Eschweiler & Potashnik, LLC

(57) ABSTRACT

The present disclosure relates to an integrated chip including a dielectric structure over a substrate. A first capacitor is disposed between sidewalls of the dielectric structure. The first capacitor includes a first electrode between the sidewalls of the dielectric structure and a second electrode between the sidewalls and over the first electrode. A second capacitor is disposed between the sidewalls. The second capacitor includes the second electrode and a third electrode between the sidewalls and over the second electrode. A third capacitor is disposed between the sidewalls. The third capacitor includes the third electrode and a fourth electrode between the sidewalls and over the third electrode. The first capacitor, the second capacitor, and the third capacitor are coupled in parallel by a first contact on a first side of the first capacitor and a second contact on a second side of the first capacitor.

20 Claims, 14 Drawing Sheets

(58) Field of Classification Search
CPC ......... H01L 28/40; H01L 28/87; H01L 28/60;
H01L 28/75; H01L 29/945; H01L 21/764;
H01L 27/0733; H01L 28/91; H01G 4/30;
H01G 4/232; H01G 4/005
See application file for complete search history.

(56) References Cited

U.S. PATENT DOCUMENTS

| | | |
|---|---|---|
| 2019/0115422 A1 | 4/2019 | Akcasu |
| 2019/0229122 A1 | 7/2019 | Cai et al. |
| 2020/0176552 A1 | 6/2020 | Chang et al. |
| 2021/0202761 A1 | 7/2021 | Cheng et al. |
| 2022/0351908 A1* | 11/2022 | Wang .................. H10B 12/038 |

* cited by examiner

MULTI-LAYER TRENCH CAPACITOR STRUCTURE

REFERENCE TO RELATED APPLICATION

This Application claims the benefit of U.S. Provisional Application No. 63/228,294, filed on Aug. 2, 2021, the contents of which are hereby incorporated by reference in their entirety.

BACKGROUND

Many modern integrated chips include transistors as well as passive devices. Some examples of passive devices include capacitors, resistors, inductors, varactors, etc. Passive devices are widely used to control integrated chip characteristics, such as gains, time constants, etc. Some passive devices include integrated passive devices (IPDs). An IPD is a collection of one or more passive devices embedded into a single monolithic device and packaged as an integrated circuit (IC).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
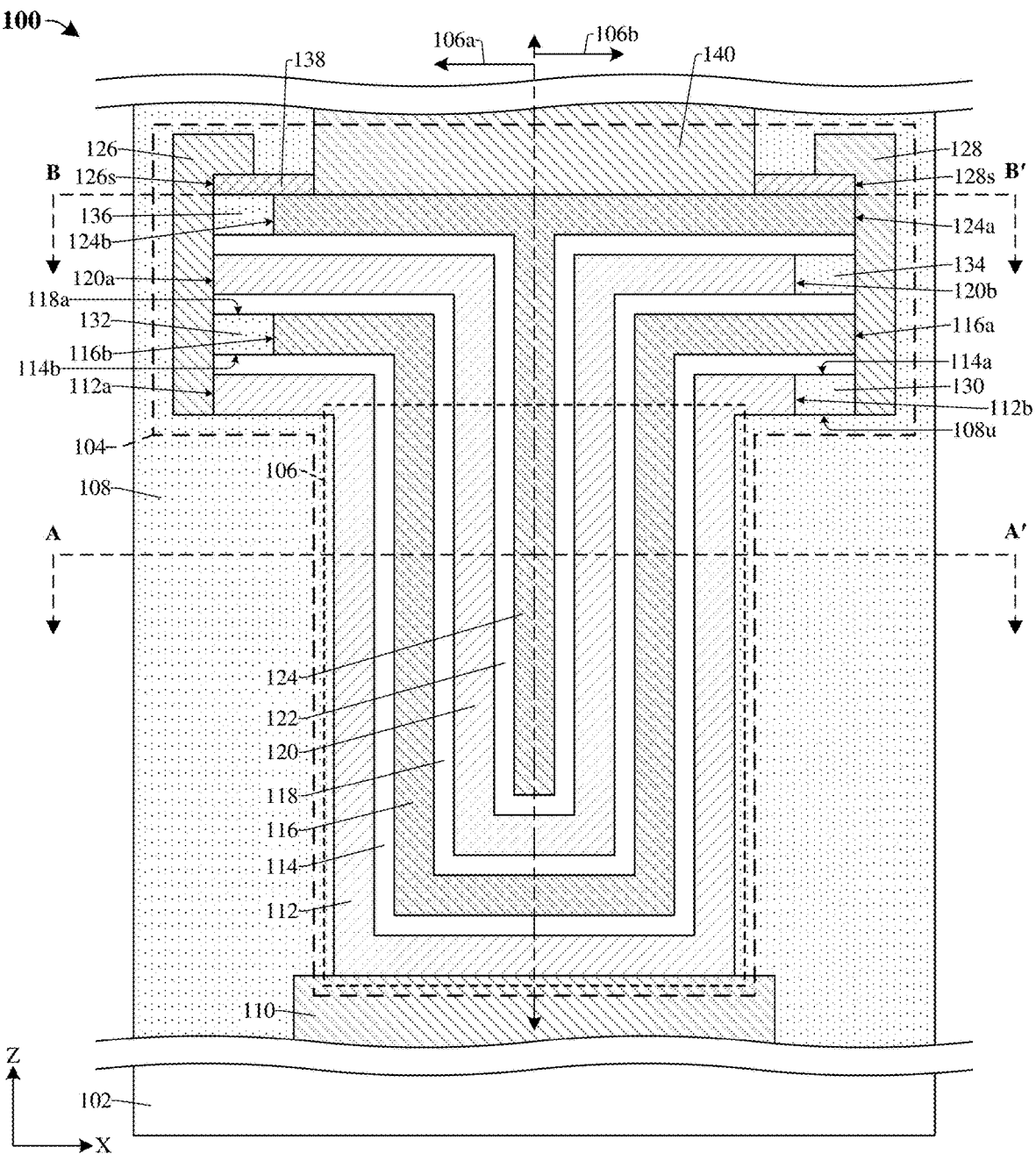
FIG. 1 illustrates a cross-sectional view of some embodiments of an integrated chip comprising a trench capacitor in a trench over a substrate, the trench capacitor comprising a plurality of electrodes in the trench.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some integrated chips include a trench capacitor in an interconnect structure of the integrated chip. For example, a trench capacitor is a metal-insulator-metal (MIM) capacitor that is disposed in a trench. The trench may be within a dielectric structure and over one or more transistor devices that are arranged along a substrate. The trench may be formed by sidewalls of the dielectric structure and an upper surface of a first metal wire that is within the dielectric structure. The trench capacitor includes a first metal electrode in the trench, a second metal electrode in the trench and over the first metal electrode, and an insulative layer between the first metal electrode and the second metal electrode. The first metal wire may be coupled to the first metal electrode and a second metal wire may be coupled to the second metal electrode.

In some instances, to increase a capacitance of the integrated chip, additional trenches and corresponding trench capacitors may be added to the integrated chip. However, as integrated chip technology advances, a pitch of the integrated chip may be reduced. As the pitch of the integrated chip is reduced, an area available for trenches and/or trench capacitors may be reduced, and hence number of possible trenches that may be included in the integrated chip may also be reduced. As a result, a capacitance of the integrated chip may be reduced. Thus, a challenge with these integrated chips is that increasing a capacitance by increasing a number of trenches in the integrated chip results in an increase in a pitch of the integrated chip. In other words, a challenge with designing these integrated chips is determining how to increase a capacitance of the integrated chip without increasing a pitch of the integrated chip.

Various embodiments of the present disclosure are related to an integrated chip comprising a trench capacitor, the trench capacitor comprising a plurality of parallelly coupled capacitors disposed in a single trench for increasing a capacitance of the integrated chip without increasing a pitch of the integrated chip. For example, the integrated chip comprises a dielectric structure over a substrate. A trench is in the dielectric structure. A first capacitor is disposed in the trench. The first capacitor includes a first electrode in the trench, a second electrode in the trench and over the first electrode, and a first insulative layer between the first electrode and the second electrode. A second capacitor is disposed in the trench. The second capacitor includes the second electrode, a third electrode in the trench and over the second electrode, and a second insulative layer between the second electrode and the third electrode. A third capacitor is disposed in the trench. The third capacitor includes the third electrode, a fourth electrode in the trench and over the third electrode, and a third insulative layer between the third electrode and the fourth electrode. The first capacitor, the second capacitor, and the third capacitor are coupled in parallel by a first contact that is arranged on a first side of the trench and a second contact that is arranged on a second side of the trench, opposite the first side.

By including the plurality of parallelly coupled capacitors (e.g., the first capacitor, the second capacitor, and the third capacitor) in the trench, a capacitance of the integrated chip may be increased without increasing a pitch of the integrated chip. For example, by coupling the plurality of capacitors in parallel by way of the first and second contacts, a capacitance of the trench capacitor may be equal or approximately equal to the sum of the capacitance of each of the capacitors, and hence the overall capacitance of the trench capacitor may be increased (e.g., tripled in embodiments with three capacitors) relative to a trench capacitor including a single capacitor in a trench. Further, by including the parallelly coupled capacitors in a single trench, the overall capacitance of the trench capacitor may be increased without adding additional trenches and hence without increasing a pitch of the integrated chip. This may be beneficial for increasing capacitance capabilities of integrated chips in advanced integrated chip technologies that have small pitch requirements.

FIG. 1 illustrates a cross-sectional view 100 of some embodiments of an integrated chip comprising a trench capacitor 104 in a trench 106 over a substrate 102, the trench capacitor 104 comprising a plurality of electrodes 112, 116, 120, 124 in the trench 106. In some embodiments, the cross-sectional view 100 of FIG. 1 is illustrated in an X-Z plane.

A dielectric structure 108 is over the substrate 102. A lower conductive wire 110 is within the dielectric structure 108. The trench 106 is in the dielectric structure 108. In some embodiments, the trench 106 is formed or delimited by sidewalls of the dielectric structure 108 and an upper surface of the lower conductive wire 110. In some embodiments, the trench 106 has trench sidewalls that correspond to the sidewalls of the dielectric structure 108 and the trench 106 has a trench lower surface that corresponds to the upper surface of the lower conductive wire 110.

A first electrode 112 is in the trench 106. The first electrode 112 lines the sidewalls of the dielectric structure 108 and the upper surface of the lower conductive wire 110. A second electrode 116 is in the trench 106 and over the first electrode 112. A first insulative layer 114 is in the trench 106 and between the first electrode 112 and the second electrode 116. The first insulative layer 114 lines sidewalls and upper surfaces of the first electrode 112, and the second electrode 116 lines sidewalls and upper surfaces of the first insulative layer 114. A third electrode 120 is in the trench 106 and over the second electrode 116. A second insulative layer 118 is in the trench 106 and between the second electrode 116 and the third electrode 120. The second insulative layer 118 lines sidewalls and upper surfaces of the second electrode 116, and the third electrode 120 lines sidewalls and upper surfaces of the second insulative layer 118. A fourth electrode 124 is in the trench 106 and over the third electrode 120. A third insulative layer 122 is in the trench 106 and between the third electrode 120 and the fourth electrode 124. The third insulative layer 122 lines sidewalls and upper surfaces of the third electrode 120, and the fourth electrode 124 lines sidewalls and upper surfaces of the third insulative layer 122.

A first contact 126 is arranged on a first side 106a of the trench 106 and a second contact 128 is arranged on a second side 106b of the trench 106, opposite the first side 106a. The first contact 126 is coupled to the first electrode 112 and the third electrode 120 at sidewalls of the first electrode 112 and the third electrode 120. The second contact 128 is coupled to the second electrode 116 and the fourth electrode 124 at sidewalls of the second electrode 116 and the fourth electrode 124.

The second contact 128 is spaced apart and electrically isolated from the first electrode 112 by a first dielectric spacer 130. The first contact 126 is spaced apart and electrically isolated from the second electrode 116 by a second dielectric spacer 132. The second contact 128 is spaced apart and electrically isolated from the third electrode 120 by a third dielectric spacer 134. The first contact 126 is spaced apart and electrically isolated from the fourth electrode 124 by a fourth dielectric spacer 136.

Figure 2:
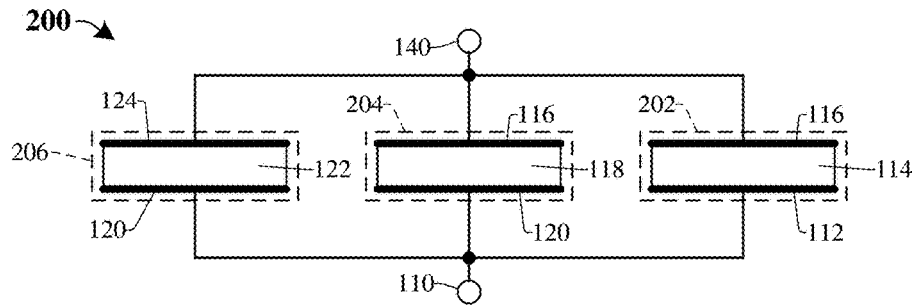
FIG. 2 illustrates a diagram of some embodiments of a circuit corresponding to the integrated chip of FIG. 1.

As illustrated in the circuit diagram 200 of FIG. 2, the first electrode 112, the second electrode 116, and the first insulative layer 114 therebetween form a first capacitor 202; the second electrode 116, the third electrode 120, and the second insulative layer 118 therebetween form a second capacitor 204; and the third electrode 120, the fourth electrode 124, and the third insulative layer 122 therebetween form a third capacitor 206. The first capacitor 202, the second capacitor 204, and the third capacitor 206 are coupled in parallel by the first contact 126 and the second contact 128.

By including a plurality (e.g., three or more) of capacitors 202, 204, 206 in the trench 106 and by coupling the capacitors in parallel by way of the first contact 126 and the second contact 128, a capacitance of trench capacitor 104 the may be increased without increasing a pitch of the integrated chip. For example, since the capacitors 202, 204, 206 are coupled in parallel by the contacts 126, 128, the capacitance of the trench capacitor 104 may be equal or approximately equal to the sum of the capacitance of each of the capacitors 202, 204, 206, and hence the capacitance of the trench capacitor 104 may be increased (e.g., tripled in the case of three capacitors relative to a trench capacitor including a single capacitor in a trench). Further, by including the parallelly coupled capacitors 202, 204, 206 in the single trench 106, rather than in multiple trenches, the pitch of the integrated chip may be reduced (e.g., relative to an integrated chip having multiple trenches). This may, for example, be beneficial for increasing capacitance capabilities in advanced integrated chip technologies where a reduced pitch is desired.

Although the trench capacitor 104 illustrated in the embodiments of FIG. 1 and FIG. 2 includes four electrodes which form three capacitors in the trench 106, it will be appreciated that in some other embodiments, the trench capacitor 104 may include a different number of electrodes (e.g., six electrodes, eight electrodes, etc.) that form a different number of parallelly coupled capacitors (e.g., five capacitors, seven capacitors, etc.) in the trench 106.

In some embodiments, an etch stop layer (ESL) 138 is on the fourth electrode 124. In some embodiments, the ESL 138 is also on the fourth dielectric spacer 136. An upper conductive wire 140 is over the fourth electrode 124. The upper conductive wire 140 is disposed within the dielectric structure 108 and extends through the ESL 138 to a top surface of the fourth electrode 124. In some embodiments, the first electrode 112 and the third electrode 120 are coupled to the lower conductive wire 110 and isolated from the upper conductive wire 140, and the second electrode 116 and the fourth electrode 124 are coupled to the upper conductive wire 140 and isolated from the lower conductive wire 110.

In some embodiments, a sidewall 126s of the first contact 126 extends along a first sidewall 112a of the first electrode 112 and a first sidewall 120a of the third electrode 120. In some embodiments, a sidewall 128s of the second contact 128 extends along a first sidewall 116a of the second electrode 116 and a first sidewall 124a of the fourth electrode 124.

In some embodiments, a second sidewall 112b of the first electrode 112, opposite the first sidewall 112a of the first electrode 112, is spaced apart and electrically isolated from the second contact 128 by the first dielectric spacer 130. In some embodiments, a second sidewall 116b of the second electrode 116, opposite the first sidewall 116a of the second electrode 116, is spaced apart and electrically isolated from the first contact 126 by the second dielectric spacer 132.

In some embodiments, the first dielectric spacer 130 extends from the second sidewall 112b of the first electrode 112 to the sidewall 128s of the second contact 128, and from an upper surface 108u of the dielectric structure 108 to a lower surface 114a of the first insulative layer 114. In some embodiments, the second dielectric spacer 132 extends from the second sidewall 116b of the second electrode 116 to the sidewall 126s of the first contact 126, and from an upper surface 114b of the first insulative layer 114 to a lower surface 118a of the second insulative layer 118.

In some embodiments, the first contact 126 extends along the first sidewall 112a of the first electrode 112, along a sidewall (not labeled) of the first insulative layer 114, along a sidewall (not labeled) of the second dielectric spacer 132, along a sidewall (not labeled) of the second insulative layer 118, along the first sidewall 120a of the third electrode 120, along a sidewall (not labeled) of the third insulative layer 122, along a sidewall (not labeled) of the fourth dielectric spacer 136, and along a sidewall (not labeled) of the ESL 138. In some embodiments, the first contact 126 further extends along a top surface of the ESL 138 directly over the first electrode 112, the first insulative layer 114, the second dielectric spacer 132, the second insulative layer 118, the third electrode 120, the third insulative layer 122, and the fourth dielectric spacer 136.

In some embodiments, the first electrode 112 and the third electrode 120 comprise a first conductive material while the second electrode 116 and the fourth electrode 124 comprise a second conductive material different from the first conductive material. In some embodiments, the first conductive material may be or comprise titanium nitride or some other suitable material and the second conductive material may be or comprise tantalum nitride or some other suitable material, or vice versa.

In some embodiments, the insulative layers 114, 118, 122 comprise one or more high-k dielectrics (e.g., zirconium oxide, aluminum oxide, or the like) or some other suitable material. In some embodiments, the dielectric structure 108 may comprise a plurality of dielectric layers that may, for example, comprise silicon dioxide, undoped silicon glass (USG), or some other suitable material. In some embodiments, the dielectric structure 108 may further comprise a plurality of etch stop layers that may, for example, comprise silicon carbide, silicon nitride, or some other suitable material. In some embodiments, the dielectric spacers 130, 132, 134, 136 may, for example, comprise silicon dioxide or some other suitable material. In some embodiments, the ESL 138 may, for example, comprise silicon nitride or some other suitable material.

In some embodiments, the lower conductive wire 110 and the upper conductive wire 140 may, for example, comprise copper or some other suitable material. In some embodiments, the first contact 126 and the second contact 128 may, for example, comprise tungsten or some other suitable material.

In some embodiments, the each of the electrodes may have a thickness of about 150 to 250 angstroms, about 200 angstroms, or some other suitable thickness. In some embodiments, each of the insulative layers may have a thickness of about 40 to 80 angstroms, about 60 angstroms, or some other suitable thickness.

In some embodiments, each of the dielectric spacers 130, 132, 134, 136 may have a thickness of about 150 to 250 angstroms, about 200 angstroms, or some other suitable thickness. In some embodiments, each of the dielectric spacers 130, 132, 134, 136 may have width of about 50 to 120 angstroms or some other suitable width. Thus, an electrode (e.g., the first electrode 112) may be separated from a neighboring contact (e.g., the second contact 128) by a distance of about 50 to 120 angstroms or some other suitable distance.

In some embodiments, a depth of the trench 106 (e.g., along the Z-axis) may, for example, be about 10 times greater than a width of the trench 106 (e.g., along the X-axis). In some embodiments, the depth of the trench 106 may be about 1.6 micrometers, about 1.3 to 1.9 micrometers, or some other suitable value. In some embodiments, the width of the trench 106 may be about 0.16 micrometers, about 0.13 to 0.19 micrometers, or some other suitable value. In some embodiments, a width of the upper conductive wire 140 is greater than the width of the trench 106. In some embodiments, a width of the lower conductive wire 110 is greater than the width of the trench 106.

Figure 3A:
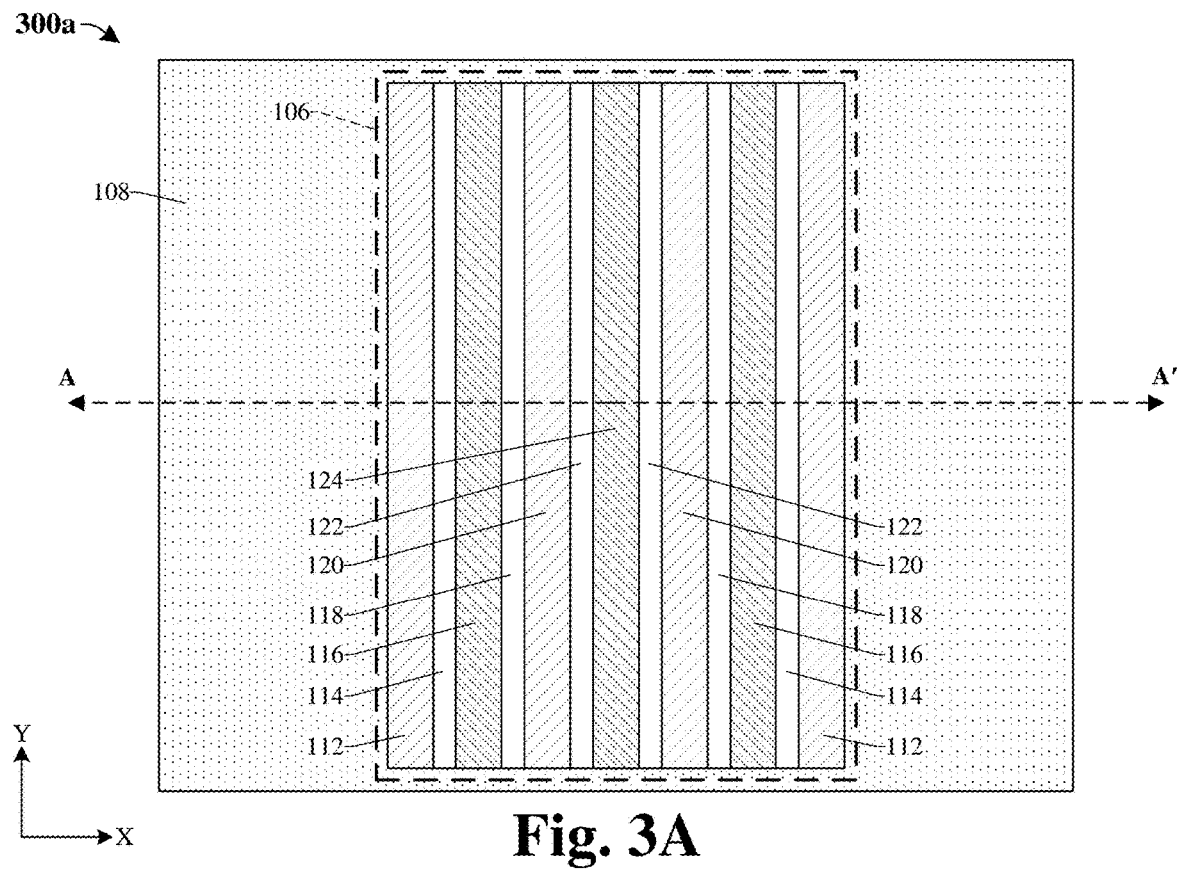
FIGS. 3A and 3B illustrate top views of some embodiments of the integrated chip of FIG. 1.
Figure 3B:
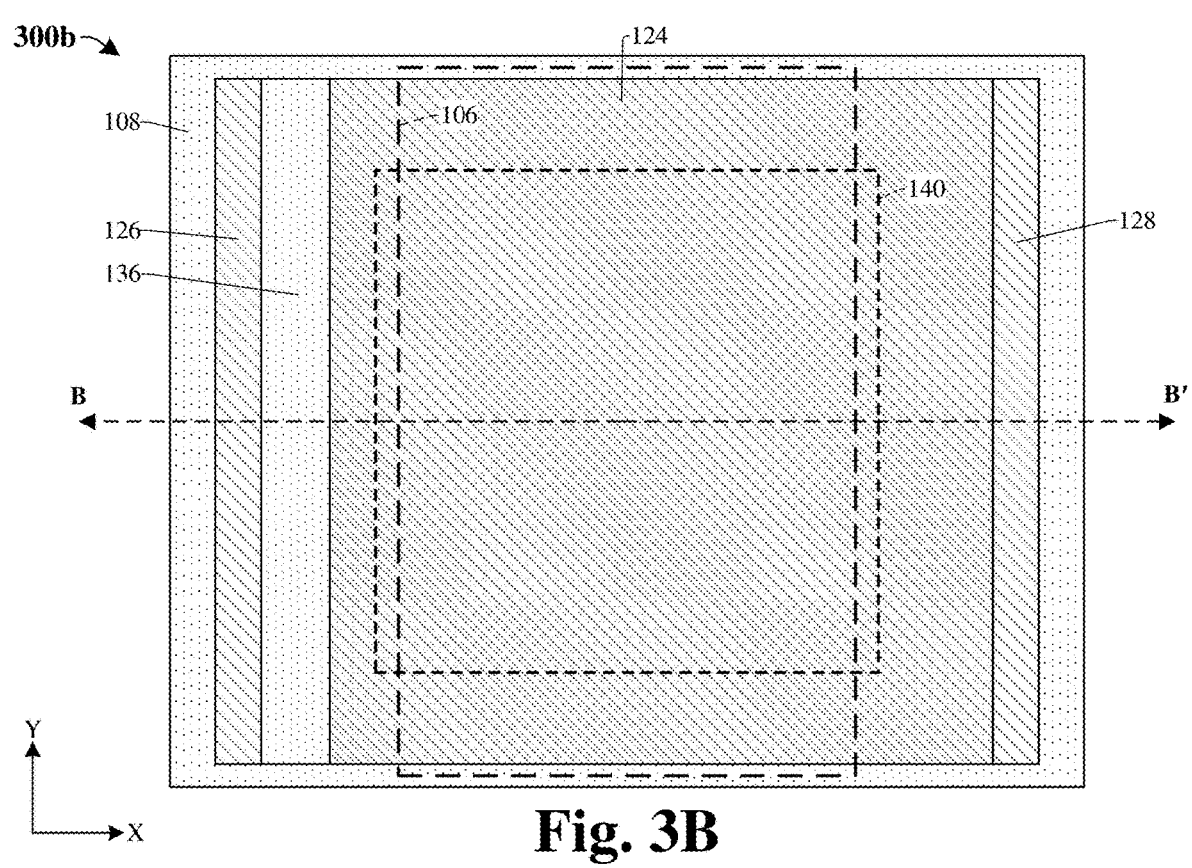

FIGS. 3A and 3B illustrate top view 300a and top view 300b, respectively, of some embodiments of the integrated chip of FIG. 1. In some embodiments, the top view 300a of FIG. 3A is taken across line A-A' of FIG. 1. In some embodiments, the top view 300b of FIG. 3B is taken across line B-B' of FIG. 1. In some embodiments, the top views 300a and 300b of FIGS. 3A and 3B are illustrated in an X-Y plane.

In some embodiments, a width of a trench 106, as measured along the X-axis, is less than a length of the trench 106 as measured along the Y-axis. In some embodiments, lengths of the electrodes 112, 116, 120, 124, the insulative layers 114, 118, 122, the dielectric spacers 130, 132, 134, 136, and the contacts 126, 128, as measured along the Y-axis, may be approximately equal.

In some embodiments, the dielectric structure 108 surrounds the trench 106. For example, the dielectric structure 108 laterally surrounds the trench 106, the electrodes 112, 116, 120, 124, and the contacts 126, 128 and separates them from neighboring devices (not shown).

Figure 4:
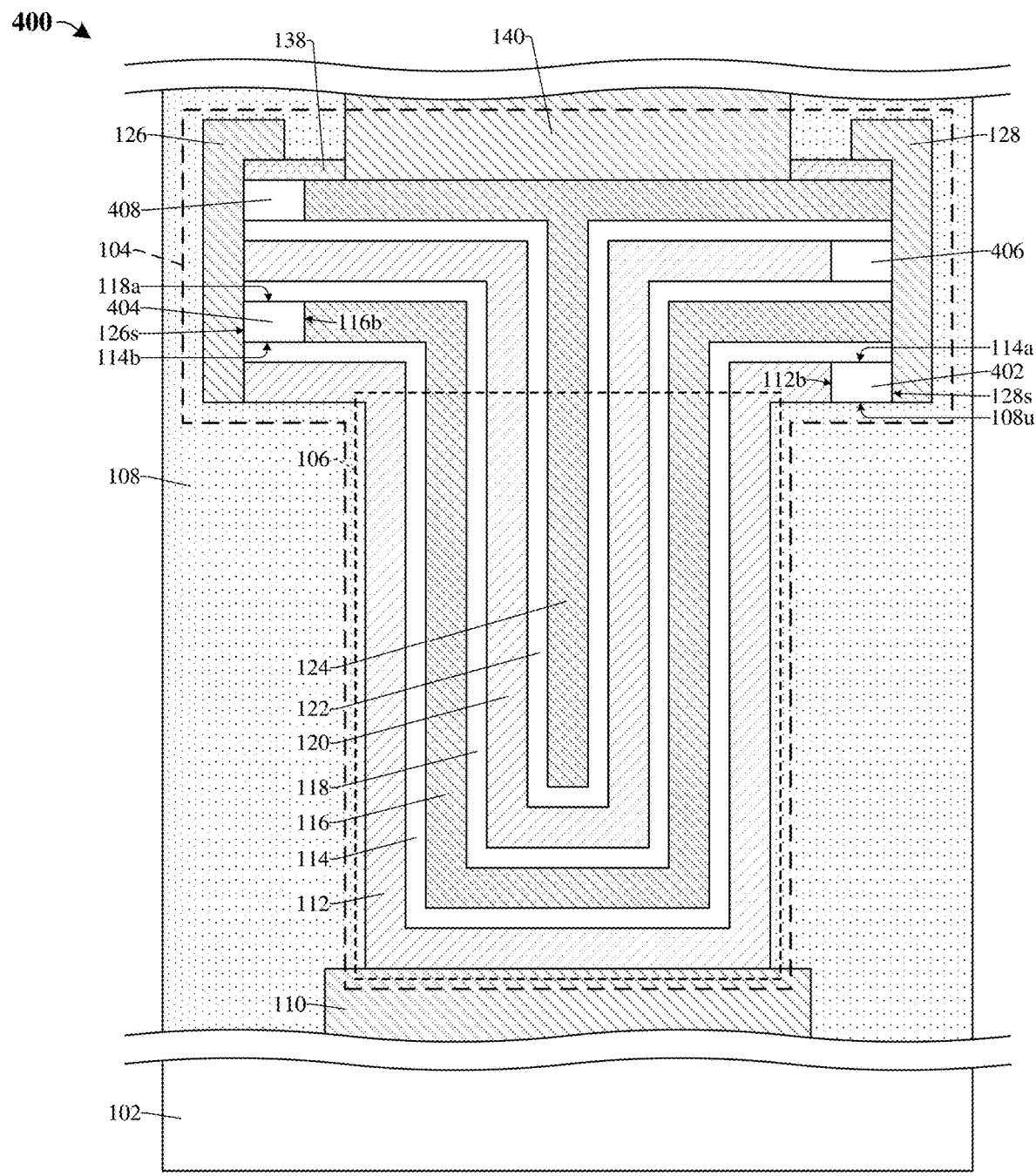
FIG. 4 illustrates a cross-sectional view of some embodiments of the integrated chip of FIG. 1 in which cavities exist along sidewalls of the plurality of electrodes.

FIG. 4 illustrates a cross-sectional view 400 of some embodiments of the integrated chip of FIG. 1 in which cavities exist along sidewalls of the plurality of electrodes.

In some embodiments, the cavities 402, 404, 406, 408 replace the dielectric spacers 130, 132, 134, 136 of the integrated chip illustrated in FIG. 1. The cavities extend between sidewalls of the electrodes 112, 116, 120, 124 and sidewalls of the contacts 126, 128. The cavities may, for example, comprise air or the like.

In some examples, a first cavity 402 separates the first electrode 112 and the second contact 128. The second sidewall 112b of the first electrode 112 is spaced apart and electrically isolated from the second contact 128 by the first cavity 402. The first cavity 402 is formed or delimited by the second sidewall 112b of the first electrode 112, the sidewall 128s of the second contact 128, the upper surface 108u of the dielectric structure 108, and the lower surface 114a of the first insulative layer 114.

Further, in some examples, a second cavity 404 separates the second electrode 116 and the first contact 126. The second sidewall 116b of the second electrode 116 is spaced apart and electrically isolated from the first contact 126 by the second cavity 404. The second cavity 404 is formed or delimited by the second sidewall 116b of the second electrode 116, the sidewall 126s of the first contact 126, the upper surface 114b of the first insulative layer 114, and a lower surface 118a of the second insulative layer 118.

By including the cavities 402, 404, 406, 408 in the integrated chip between the electrodes and neighboring contacts, an electrical isolation between the electrodes and their neighboring contacts may be improved. For example, an electrical isolation between the first electrode 112 and the second contact 128 may be improved. As a result, a performance of the integrated chip may be further improved.

Figure 5:
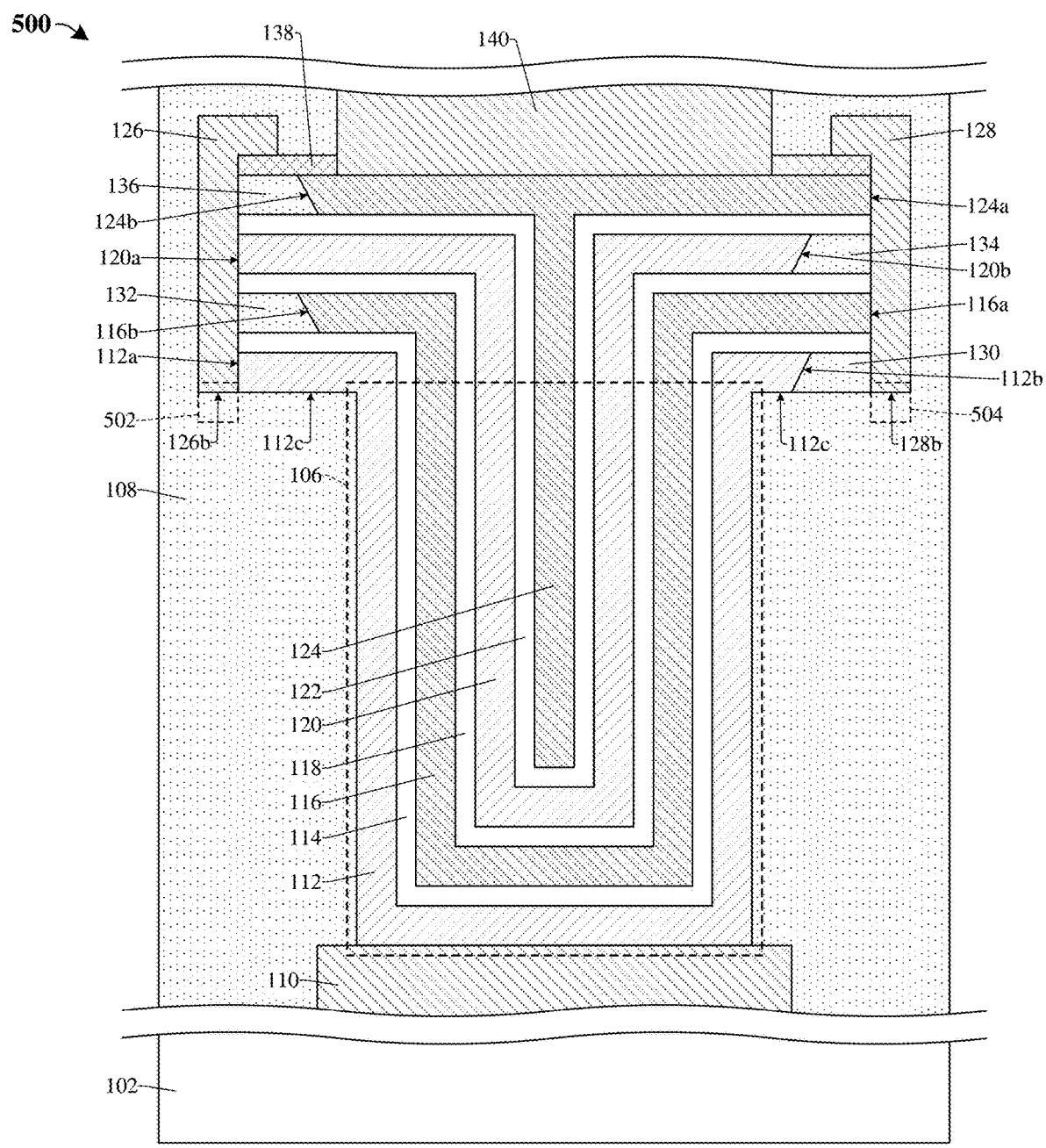
FIG. 5 illustrates a cross-sectional view of some embodiments of the integrated chip of FIG. 1 in which the plurality of electrodes have sloped sidewalls.

FIG. 5 illustrates a cross-sectional view 500 of some embodiments of the integrated chip of FIG. 1 in which the plurality of electrodes have sloped sidewalls.

For example, in some embodiments, the second sidewall 112b of the first electrode 112, the second sidewall 116b of the second electrode 116, the second sidewall 120b of the third electrode 120, and the second sidewall 124b of the fourth electrode 124 are sloped. In some examples, sidewalls of the dielectric spacers 130, 132, 134, 136 are similarly sloped.

In some instances, the electrodes 112, 116, 120 124 have sloped sidewalls because one or more wet etching processes used to recess the electrodes during the fabrication of the integrated chip (see, for example, FIGS. 12 and 15) may etch the sidewalls of the electrodes along bottoms of the sidewalls at a faster rate than along tops of the sidewalls. As a result, the sidewalls are sloped towards a center of the trench 106 from tops of the sidewalls to bottoms of the sidewalls, as illustrated in FIG. 5.

In some other instances (not shown), the one or more wet etching processes used to recess the electrodes may etch the sidewalls of the electrodes along tops of the sidewalls at a faster rate than along bottoms of the sidewalls. As a result, the sidewalls may be sloped towards a center of the trench 106 from bottoms of the sidewalls to tops of the sidewalls (not shown). Further, the sloped sidewalls can be tapered in a linear fashion as illustrated, but in other embodiments the sloped sidewalls can be rounded, curved, or irregularly shaped.

In some embodiments, depths at which bottom surfaces of the first contact 126 and the second contact 128 are disposed may vary. For example, a bottom surface 126b of the first contact 126 may be disposed anywhere within the range 502 illustrated in FIG. 5, and a bottom surface 128b of the second contact 128 may be disposed anywhere within the range 504 illustrated in FIG. 5. Thus, the bottom surfaces of the first contact 126 and/or the second contact 128 may be disposed above lower surfaces 112c of the first electrode 112 or below the lower surfaces 112c of the first electrode 112.

Figure 6:
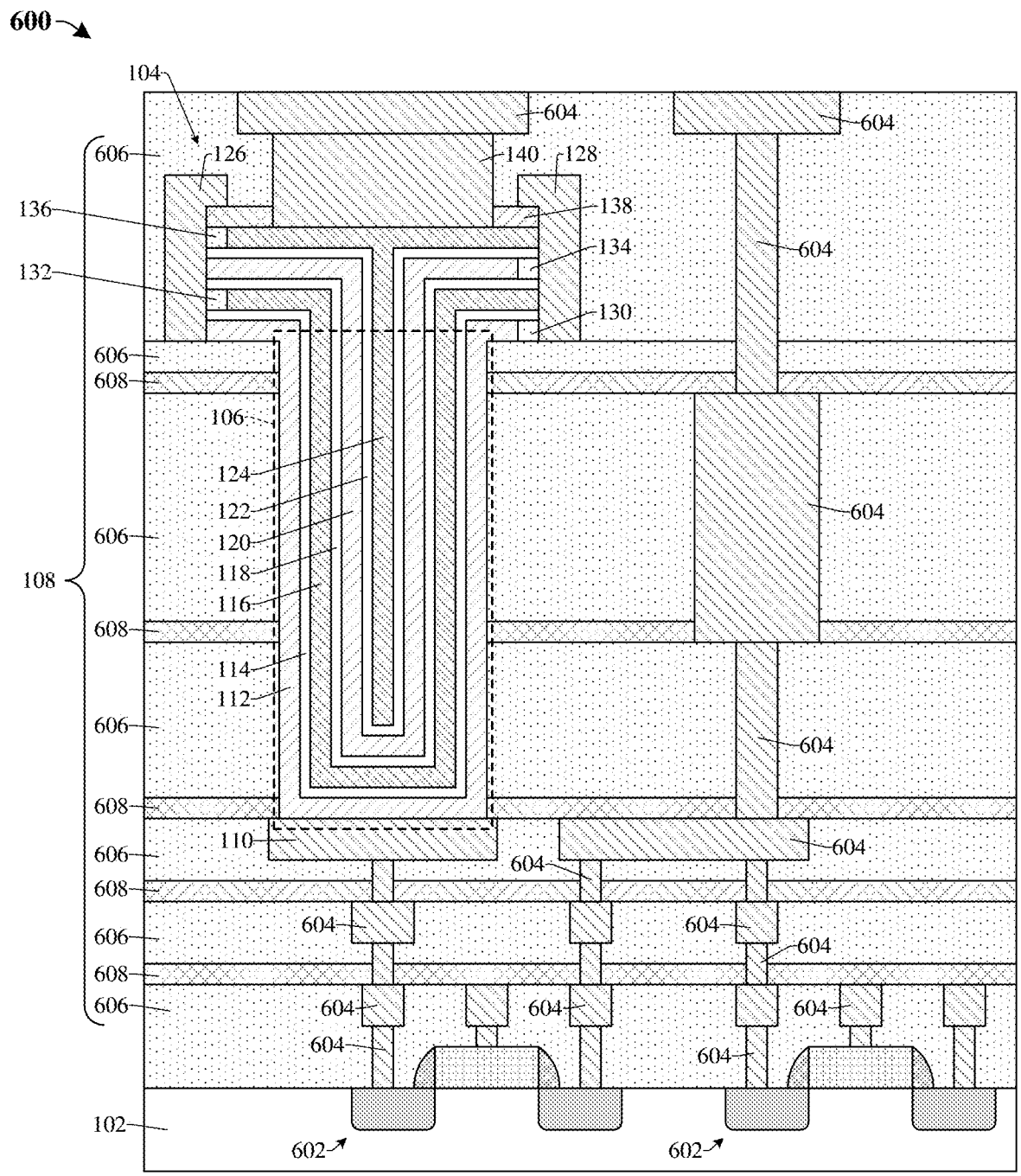
FIG. 6 illustrates a cross-sectional view of some embodiments of an integrated chip comprising the trench capacitor of FIG. 1 over a plurality of transistor devices that are arranged along the substrate.

FIG. 6 illustrates a cross-sectional view 600 of some embodiments of an integrated chip comprising the trench capacitor 104 of FIG. 1 over a plurality of transistor devices 602 that are arranged along the substrate 102.

In some embodiments, one or more of the transistor devices 602 are be coupled to the trench capacitor 104 by way of the lower conductive wire 110 and a plurality of other conductive wires 604 that are in the dielectric structure 108 between the trench capacitor 104 and the transistor devices 602.

In some embodiments, the dielectric structure 108 comprises a plurality of dielectric layers 606 and a plurality of etch stop layers (ESLs) 608. The plurality of other conductive wires 604 are within the dielectric layers 606 and the ESLs 608, and may extend through some of the dielectric layers 606 and the ESLs 608.

In some embodiments, the transistor devices 602 may, for example, be or comprise a metal-oxide-semiconductor field effect transistor (MOSFET) devices, a junction field-effect transistor (JFET) devices, a fin field-effect transistor (Fin FET) devices, a gate-all-around field-effect transistor (GAA FET) devices, or some other suitable transistor device.

Figure 7:
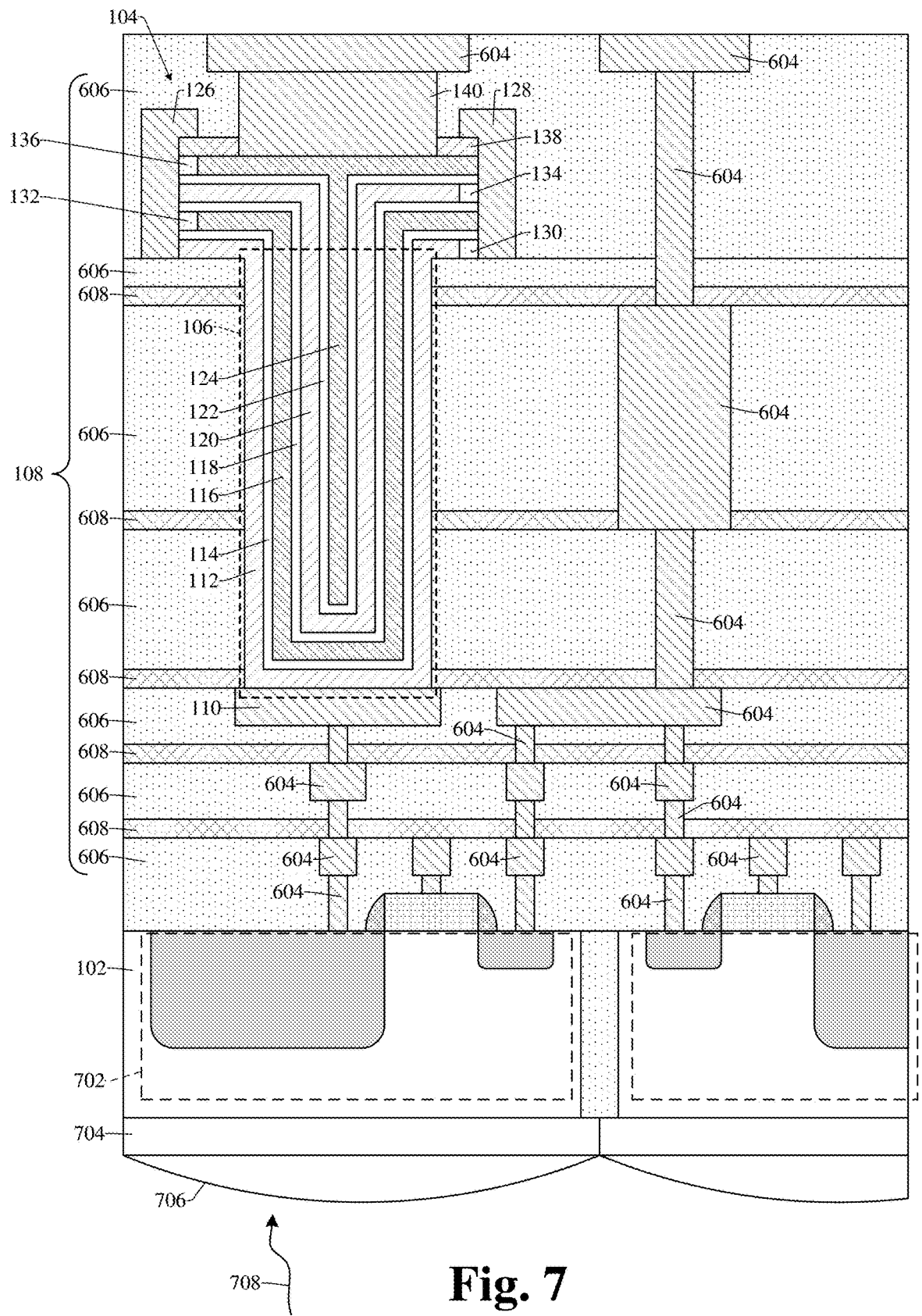
FIG. 7 illustrates a cross-sectional view of some embodiments of an integrated chip comprising the trench capacitor of FIG. 1 over a photodetector that is within the substrate.

FIG. 7 illustrates a cross-sectional view 700 of some embodiments of an integrated chip comprising the trench capacitor of FIG. 1 over a photodetector 702 that is within the substrate 102.

For example, the photodetector 702 may include a photodiode, a transfer gate, and a floating diffusion region (not labeled). The integrated chip may further comprise a color filter 704 and a micro lens 706 along a backside of the substrate 102. Photons 708 may impinge on the backside of the substrate 102 such that the integrated chip is backside illuminated (BSI). The trench capacitor may be coupled to the photodetector 702 by way of the lower conductive wire 110 and the plurality of other conductive wires 604.

FIGS. 8-20 illustrate cross-sectional views 800-2000 of some embodiments of a method for forming an integrated chip comprising a trench capacitor 104, the trench capacitor 104 comprising a plurality of electrodes in a trench 106. Although FIGS. 8-20 are described in relation to a method, it will be appreciated that the structures disclosed in FIGS. 8-20 are not limited to such a method, but instead may stand alone as structures independent of the method.

Figure 8:
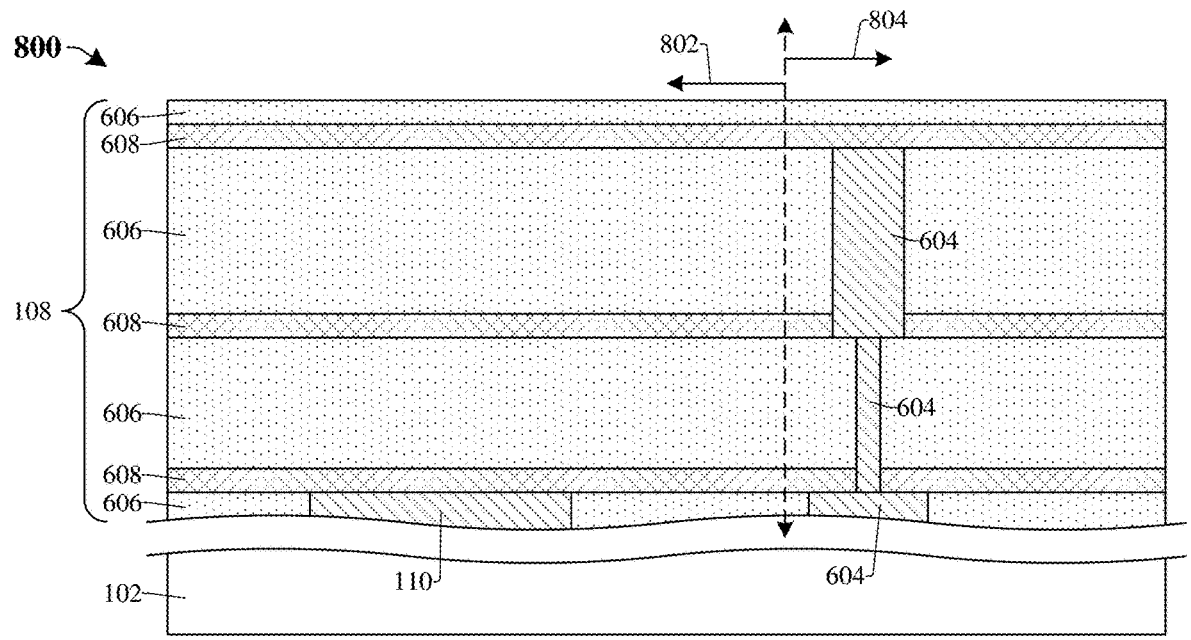
FIGS. 8-20 illustrate cross-sectional views of some embodiments of a method for forming an integrated chip comprising a trench capacitor, the trench capacitor comprising a plurality of electrodes in a trench.

As shown in cross-sectional view 800 of FIG. 8, a dielectric structure 108 comprising a plurality of dielectric layers 606 and a plurality of ESLs 608 is formed over a substrate 102. Further, a lower conductive wire 110 and a plurality of other conductive wires 604 are formed within the dielectric structure 108. In some embodiments, the lower conductive wire 110 is arranged on a capacitor side 802 of the dielectric structure 108 and the plurality of other conductive wires 604 are arranged on a logic side 804 of the dielectric structure 108.

In some embodiments, the plurality of dielectric layers 606 are formed by depositing silicon dioxide, undoped silicon glass (USG), or some other suitable material over the substrate 102 by a chemical vapor deposition (CVD) process, a physical vapor deposition (PVD) process, an atomic layer deposition (ALD) process, or some other suitable process. In some embodiments, the plurality of ESLs 608 are formed by depositing silicon carbide, silicon nitride, or some other suitable material over the substrate 102 by a CVD process, a PVD process, an ALD process, or some other suitable process. In some embodiments, the lower conductive wire 110 and the other conductive wires 604 are formed within the dielectric structure 108 by patterning the dielectric structure 108 and depositing copper or some other suitable material over the patterned dielectric structure 108 by a CVD process, a PVD process, an ALD process, a sputtering process, an electrochemical deposition (ECD) process, an electroless deposition (ELD) process, or some other suitable process.

Figure 9:
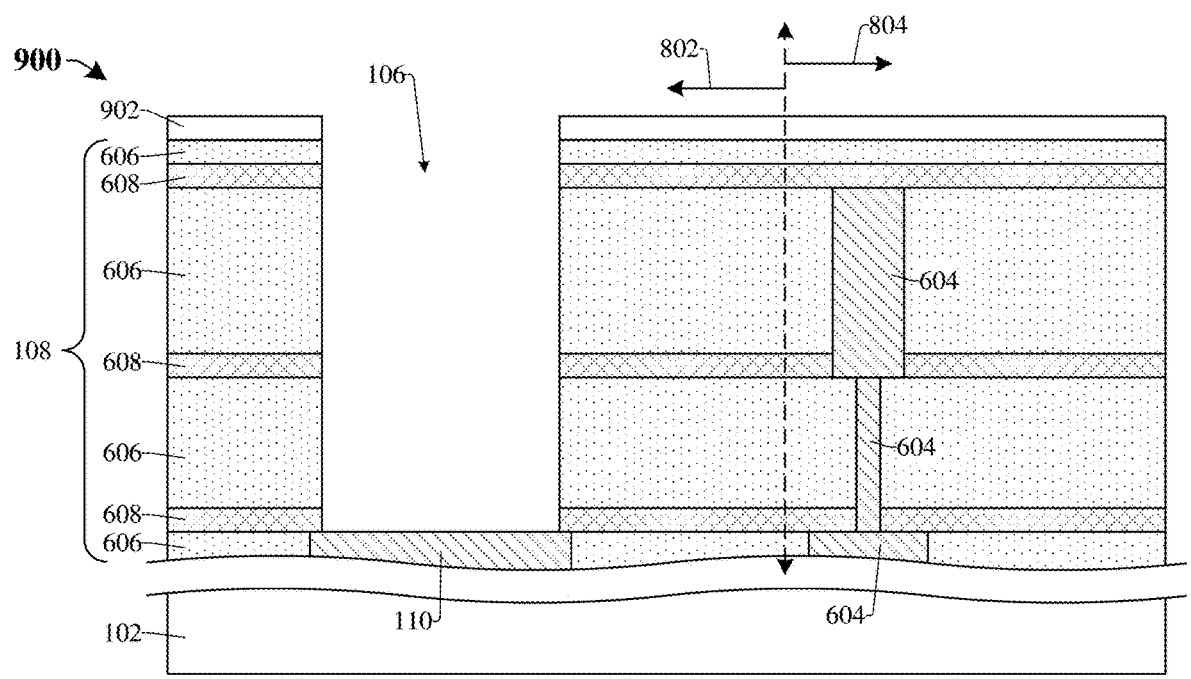

As shown in cross-sectional view 900 of FIG. 9, a masking layer 902 is formed over the dielectric structure 108. The dielectric structure 108 is patterned according to the masking layer 902 to form a trench 106 in the dielectric structure 108. The patterning uncovers an upper surface of the lower conductive wire 110. In some embodiments, the trench 106 is delimited by sidewalls of the dielectric structure 108 and the upper surface of the lower conductive wire 110.

In some embodiments, the patterning comprises a dry etching process such as, for example, a plasma etching process, a reactive ion etching (RIE) process, an ion beam etching (IBE) process, or some other suitable process. In some embodiments, the masking layer 902 comprises a photoresist mask, a hard mask, some other suitable mask, or any combination of the foregoing. In some embodiments, the masking layer 902 is removed after the patterning.

Figure 10:
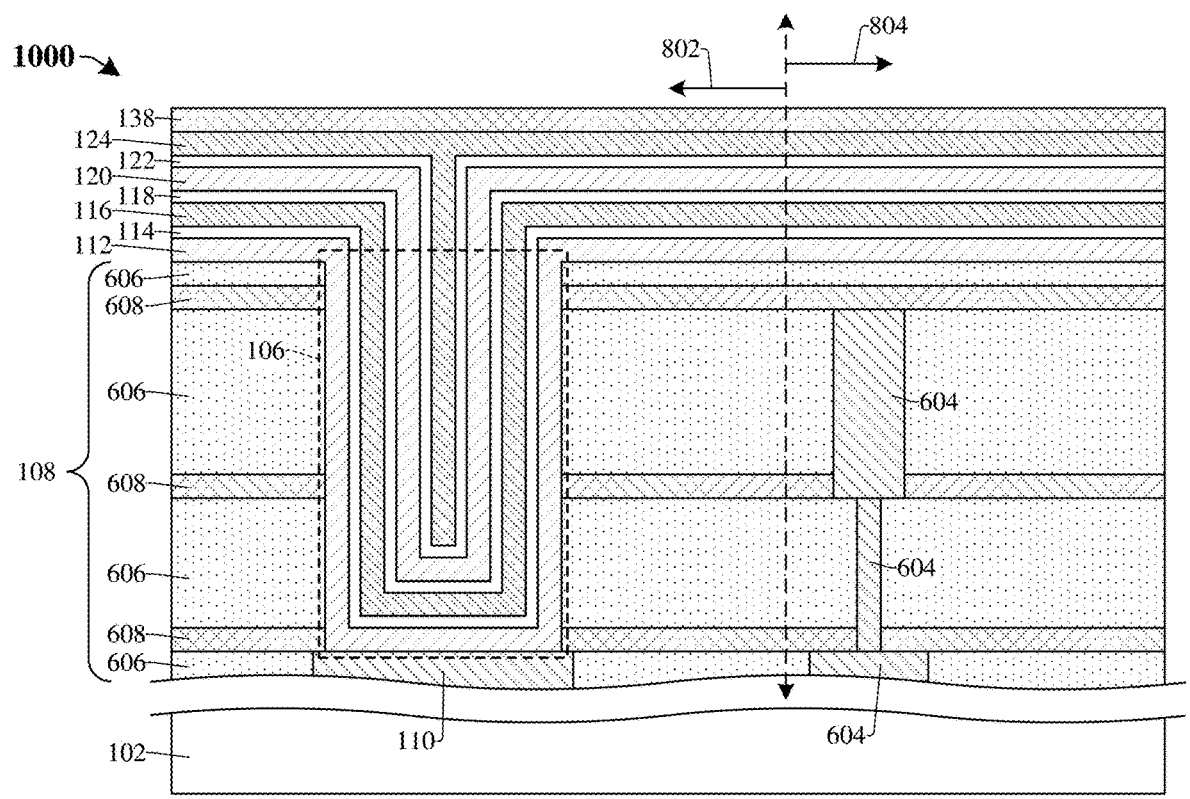

As shown in cross-sectional view 1000 of FIG. 10, a plurality of electrodes and a plurality of insulative layers are deposited over the substrate 102 and in the trench 106 in an alternating fashion. For example, a first electrode 112 is conformally deposited in the trench 106 and over the dielectric structure 108. A first insulative layer 114 is conformally deposited in the trench 106 over the first electrode 112. A second electrode 116 is conformally deposited in the trench 106 over the first insulative layer 114. A second insulative layer 118 is conformally deposited in the trench 106 over the second electrode 116. A third electrode 120 is conformally deposited in the trench 106 over the second insulative layer 118. A third insulative layer 122 is conformally deposited in the trench 106 over the third electrode 120. A fourth electrode 124 is conformally deposited in the trench 106 over the third insulative layer 122. The fourth electrode 124 fills a remainder of the trench 106. In some embodiments, an ESL 138 is formed over the fourth electrode 124.

In some embodiments, the odd numbered electrodes (e.g., first electrode 112 and the third electrode 120) comprise titanium nitride or some other suitable material and are deposited by a CVD process, a PVD process, an ALD process, a sputtering process, an ECD process, and ELD process, or some other suitable process. In some embodiments, the even numbered electrodes (e.g., second electrode 116 and the fourth electrode 124) comprise tantalum nitride or some other suitable material and are deposited by a CVD process, a PVD process, an ALD process, a sputtering process, an ECD process, and ELD process, or some other suitable process.

In some alternative embodiments, the odd numbered electrodes 112, 120 comprise tantalum nitride or some other suitable material while the even numbered electrodes 116, 124 comprise titanium nitride or some other suitable material.

In some embodiments, the insulative layers 114, 118, 122 comprise a high-k dielectric (e.g., zirconium oxide, aluminum oxide, or the like) or some other suitable material and are deposited by a CVD process, a PVD process, and ALD process, or some other suitable process. In some embodiments, the ESL 138 comprises silicon nitride or some other suitable material and is deposited by a CVD process, a PVD process, and ALD process, or some other suitable process.

Figure 11:
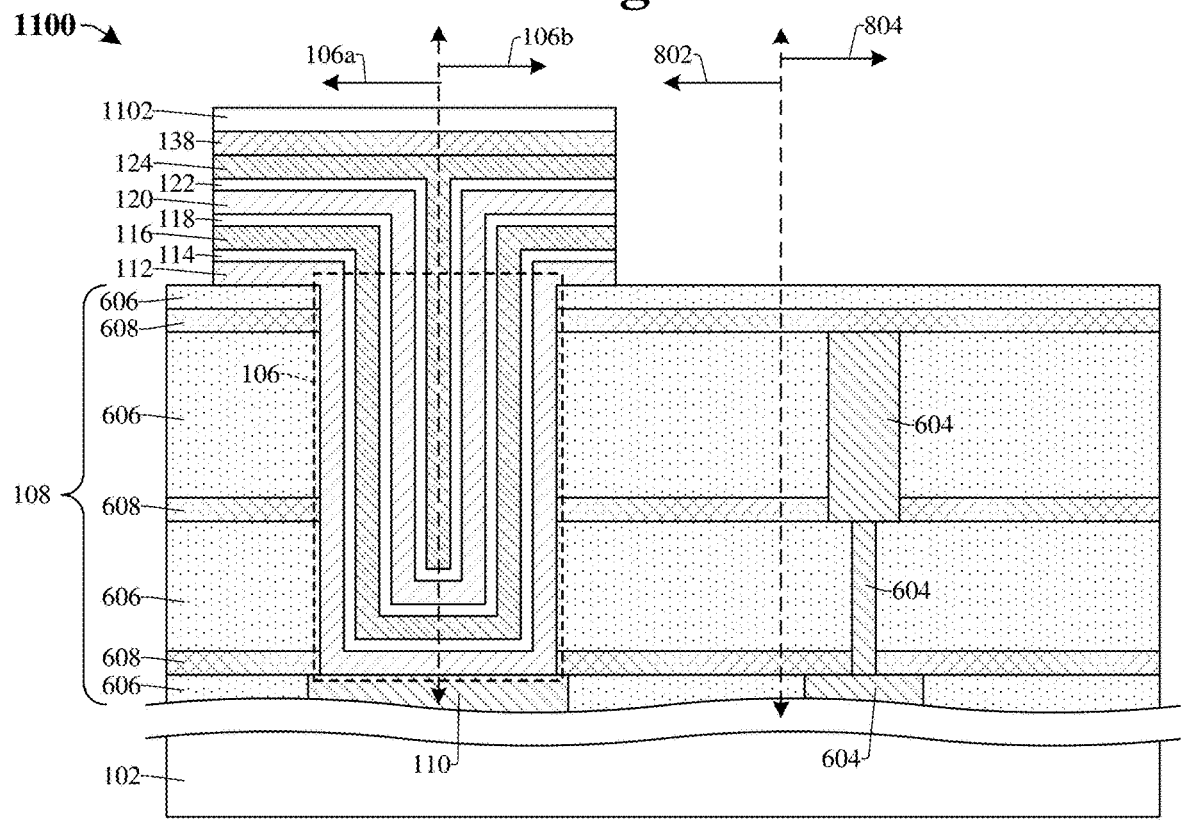

As shown in cross-sectional view 1100 of FIG. 11, a masking layer 1102 is formed over the ESL 138. The ESL 138, the electrodes 112, 116, 120, 124, and the insulative layers 114, 118, 122 are patterned according to the masking layer 1102. The patterning removes the aforementioned layers from portions of an upper surface of the dielectric structure 108. For example, the patterning removes the aforementioned layers from a portion of the upper surface of the dielectric structure 108 that is on the capacitor side 802 of the integrated chip and on a first side 106a of the trench 106, from a portion of the upper surface of the dielectric structure 108 that is on the capacitor side 802 of the integrated chip and on a second side 106b of the trench 106, opposite the first side 106a, and from a portion of the upper surface of the dielectric structure 108 that is on the logic side 804 of the dielectric structure 108. As a result, portions of the upper surface of the dielectric structure 108 are uncovered after the patterning. In some embodiments, the patterning determines the width of the trench capacitor.

In some embodiments, the patterning comprises a dry etching process or some other suitable process. In some embodiments, the masking layer 1102 comprises a photoresist mask, a hard mask, some other suitable mask, or any combination of the foregoing. In some embodiments, the masking layer 1102 is removed after the patterning.

Figure 12:
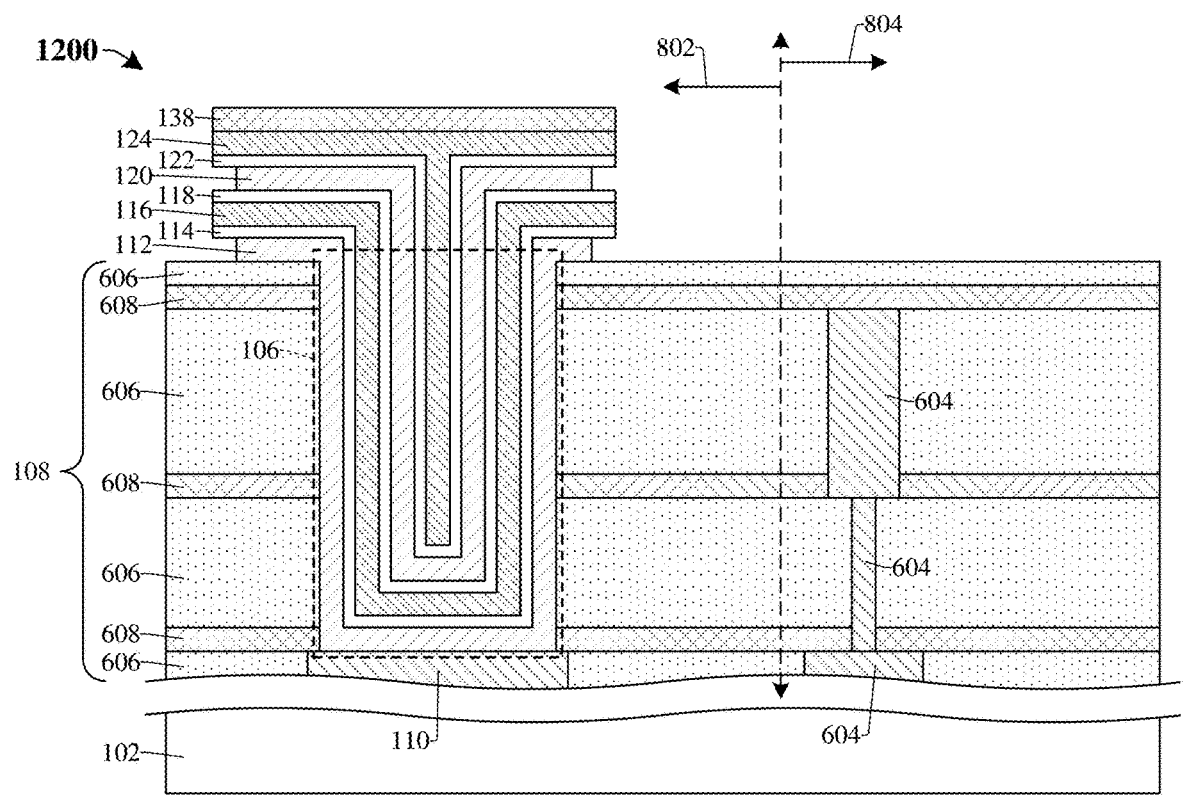

As shown in cross-sectional view 1200 of FIG. 12, a first wet etching process is performed. The first wet etching process selectively recesses the odd numbered electrodes (e.g., the first electrode 112 and the third electrode 120) without substantially etching the insulative layers 114, 118, 122, the even numbered electrodes (e.g., the second electrode 116 and the fourth electrode 124), the ESL 138, and the dielectric structure 108. For example, the first wet etching process is selective to the material(s) (e.g., titanium nitride or the like) of the odd numbered electrodes 112, 120. The first wet etching process laterally recesses the odd numbered electrodes 112, 120 at sidewalls of the odd numbered electrodes 112, 120. As a result, the sidewalls of the odd numbered electrodes 112, 120 are offset (e.g., set back) from sidewalls of the even numbered electrodes 116, 124, sidewalls of the insulative layers 114, 118, 122, and sidewalls of the ESL 138. In some embodiments, the first wet etching process may laterally recess the odd numbered electrodes 112, 120 by about 50 to 120 angstroms or some other suitable distance.

In some embodiments (e.g., embodiments in which the odd numbered electrodes 112, 120 comprise titanium nitride or the like), the first wet etching process utilizes hydrochloric acid, hydrogen peroxide, some other suitable wet etchant, or any combination of the foregoing. In some embodiments, the first wet etching process is substantially selective to the material(s) of the odd numbered electrodes 112, 120. For example, the first wet etching process removes the odd numbered electrodes 112, 120 at a rate that is about 10 times greater than a rate at which it removes the even numbered electrodes 116, 124. In some embodiments, the odd numbered electrodes 112, 120 may have sloped sidewalls (see, for example, FIG. 5) due to the first wet etching process etching the sidewalls at a slightly different rate along tops of the sidewalls than along bottoms of the sidewalls.

Figure 13:
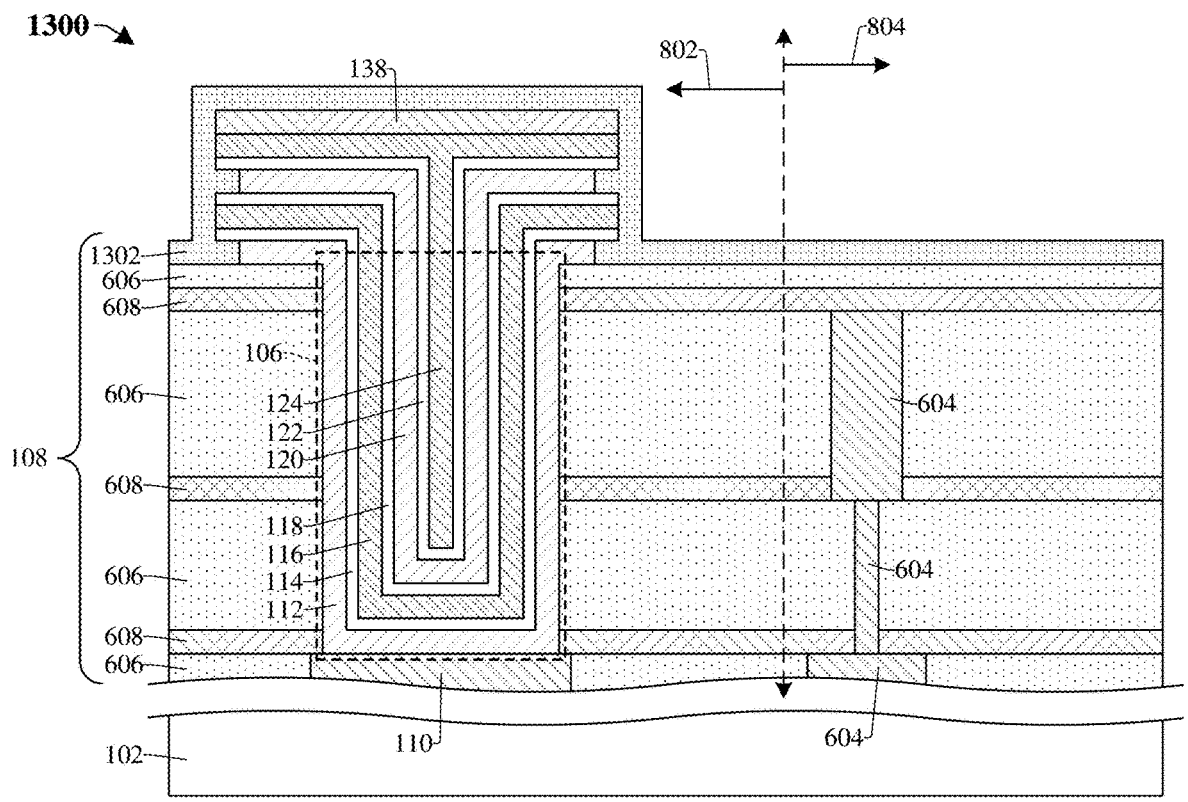

As shown in cross-sectional view 1300 of FIG. 13, a first upper dielectric layer 1302 is conformally deposited over the dielectric structure 108, over the ESL 138, and along sidewalls of the ESL 138, the electrodes 112, 116, 120, 124, and the insulative layers 114, 118, 122. The first upper dielectric layer 1302 fills regions along the sidewalls of the odd numbered electrodes 112, 120 where the odd numbered electrodes 112, 120 were recessed during the first wet etching process. In some embodiments, the first upper dielectric layer 1302 is considered part of the dielectric structure 108.

In some embodiments, the first upper dielectric layer 1302 comprises silicon dioxide or some other suitable material and is deposited by a CVD process, a PVD process, an ALD process, or some other suitable process.

Figure 14:
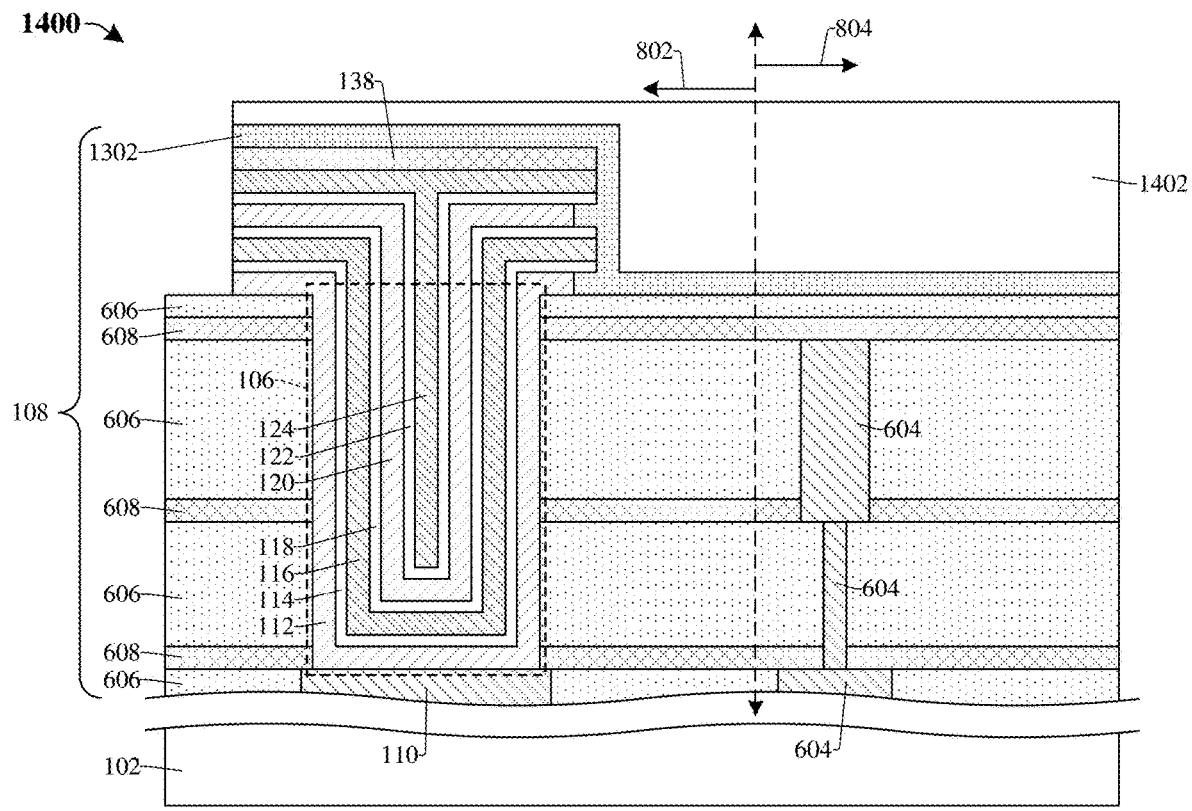

As shown in cross-sectional view 1400 of FIG. 14, a masking layer 1402 is formed over the first upper dielectric layer 1302. The first upper dielectric layer 1302, the ESL 138, the electrodes 112, 116, 120, 124, and the insulative layers 114, 118, 122 are patterned according to the masking layer 1402. The patterning removes portions of the first upper dielectric layer 1302, the ESL 138, the electrodes 112, 116, 120, 124, and the insulative layers 114, 118, 122 that are on the first side of the trench 106. In some embodiments, sidewalls of the first upper dielectric layer 1302, the ESL 138, the electrodes 112, 116, 120, 124, and the insulative layers 114, 118, 122 that are on the first side of the trench 106 are approximately coplanar as a result of the patterning.

In some embodiments, the patterning comprises a dry etching process or some other suitable process. In some embodiments, the masking layer 1402 comprises a photoresist mask, a hard mask, some other suitable mask, or any combination of the foregoing. In some embodiments, the masking layer 1402 is removed after the patterning.

Figure 15:
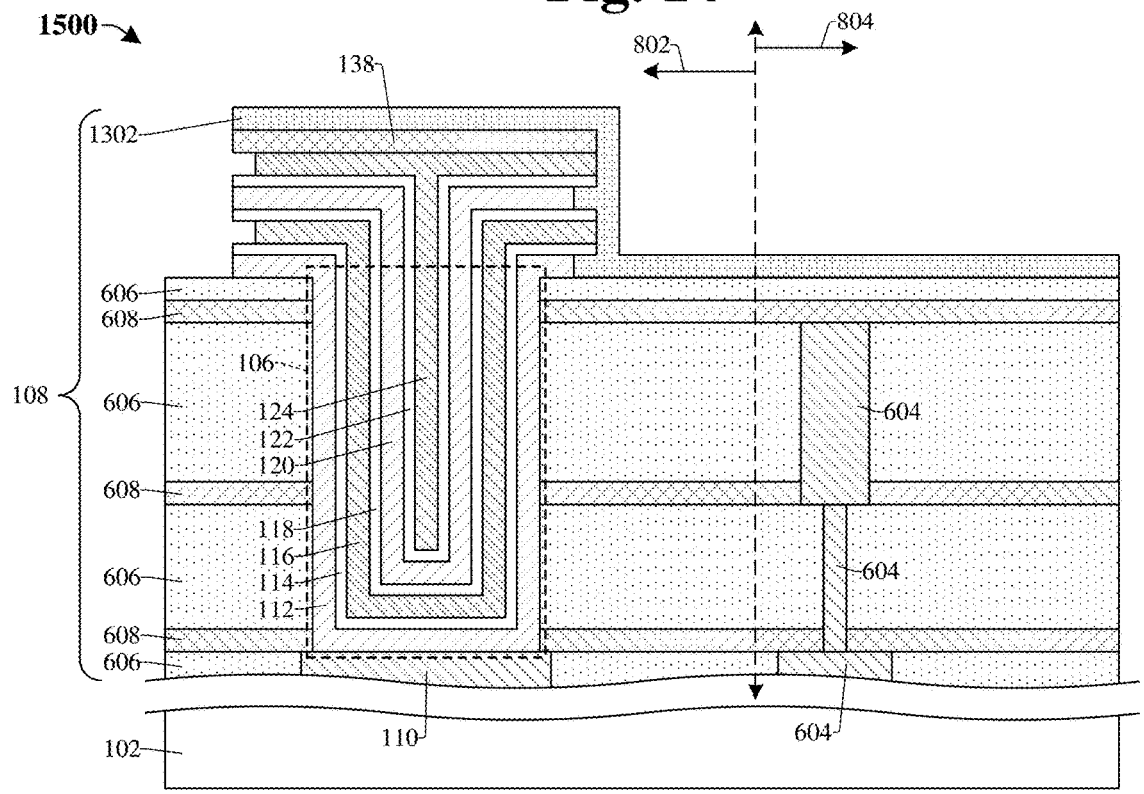

As shown in cross-sectional view 1500 of FIG. 15, a second wet etching process is performed. The second wet etching process selectively recesses the even numbered electrodes 116, 124 without substantially etching the insulative layers 114, 118, 122, the odd numbered electrodes 112, 120, the ESL 138, and the dielectric structure 108 (including the first upper dielectric layer 1302). For example, the second wet etching process is selective to the material(s) (e.g., tantalum nitride or the like) of the even numbered electrodes 116, 124. The second wet etching process laterally recesses the even numbered electrodes 116, 124 at sidewalls of the even numbered electrodes 116, 124 that are uncovered by the first upper dielectric layer 1302 (i.e., at sidewalls that are on the first side of the trench 106). As a result, the sidewalls of the even numbered electrodes 116, 124 are offset (e.g., set back) from sidewalls of the odd numbered electrodes 112, 120, sidewalls of the insulative layers 114, 118, 122, and a sidewall of the ESL 138 that are on the first side of the trench 106. In some embodiments, the second wet etching process may laterally recess the even numbered electrodes 116, 124 by about 50 to 120 angstroms or some other suitable distance.

In some embodiments (e.g., embodiments in which the even numbered electrodes 116, 124 comprise tantalum nitride or the like), the second wet etching process utilizes ammonium hydroxide, hydrogen peroxide, water, some other suitable wet etchant, or any combination of the foregoing. In some embodiments, the second wet etching process is substantially selective to the material(s) of the even numbered electrodes 116, 124. For example, the second wet etching process removes the even numbered electrodes 116, 124 at a rate that is about 6 times greater than a rate at which it removes the odd numbered electrodes 112, 120.

In some embodiments, the even numbered electrodes 116, 124 may have sloped sidewalls (see, for example, FIG. 5) due to the wet second etching process etching the sidewalls at a slightly different rate along tops of the sidewalls than along bottoms of the sidewalls.

Figure 16:
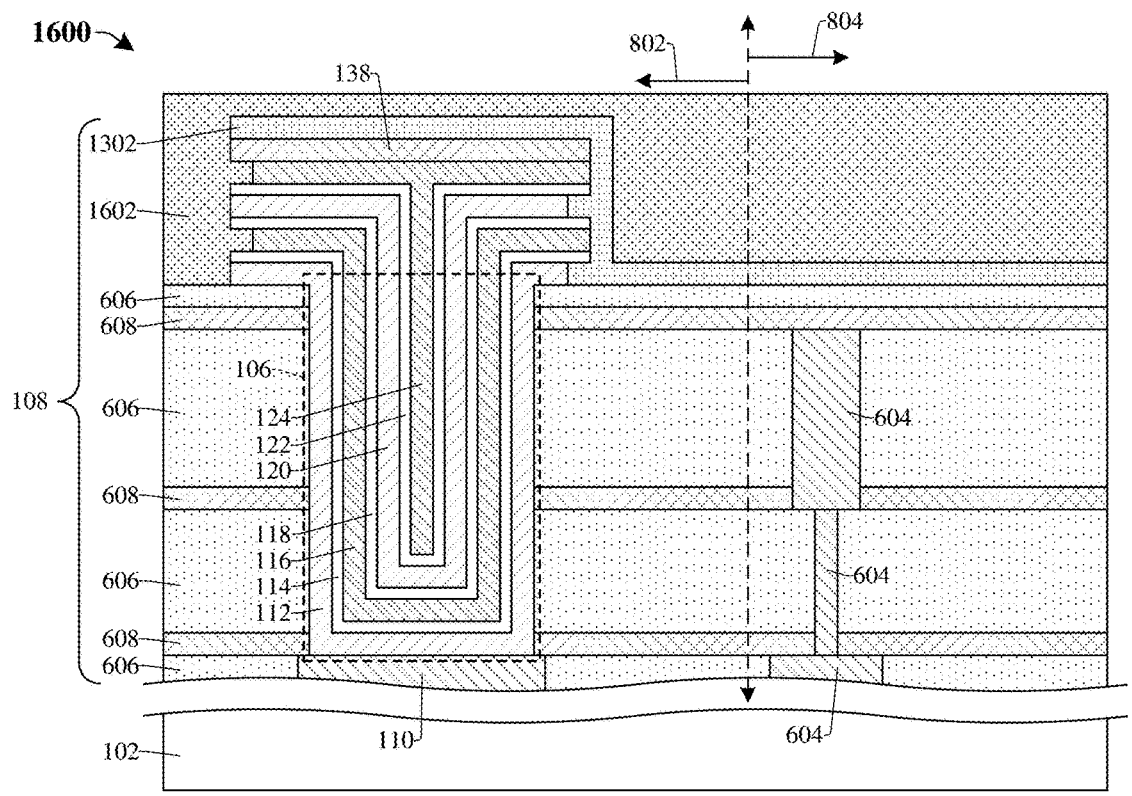

As shown in cross-sectional view 1600 of FIG. 16, a second upper dielectric layer 1602 is deposited over the dielectric structure 108 and along the sidewalls of the first upper dielectric layer 1302, the ESL 138, the electrodes 112, 116, 120, 124, and the insulative layers 114, 118, 122 that are on the first side of the trench 106. The second upper dielectric layer 1602 fills regions along the sidewalls of the even numbered electrodes 116, 124 where the even numbered electrodes 116, 124 were recessed during the second wet etching process. In some embodiments, the second upper dielectric layer 1602 is considered part of the dielectric structure 108.

In some embodiments, the second upper dielectric layer 1602 comprises silicon dioxide or some other suitable material and is deposited by a CVD process, a PVD process, an ALD process, or some other suitable process.

Figure 17:
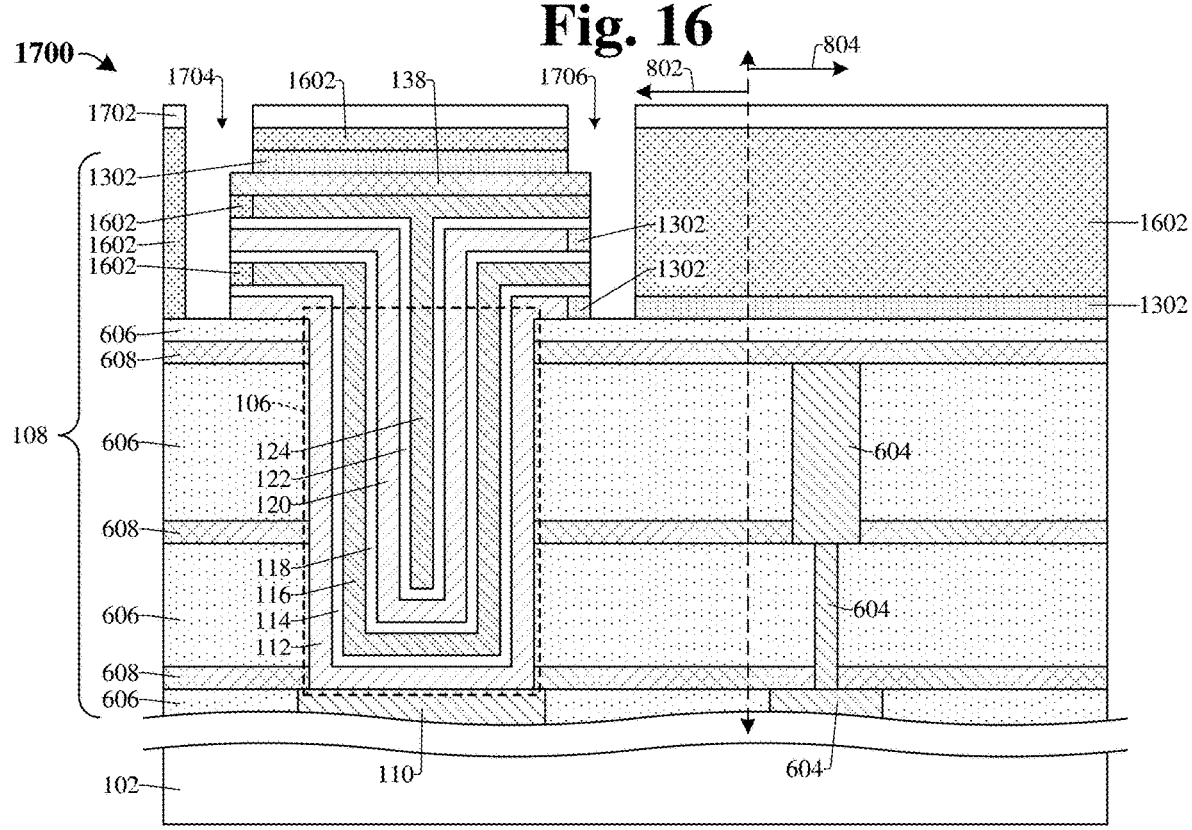

As shown in cross-sectional view 1700 of FIG. 17, a masking layer 1702 is formed over the second upper dielectric layer 1602. The second upper dielectric layer 1602 and the first upper dielectric layer 1302 are patterned according to the masking layer 1702. The patterning removes a portion of the second upper dielectric layer 1602 that is on the first side of the trench 106, a portion of the second upper dielectric layer 1602 that is on the second side of the trench 106, a portion of the first upper dielectric layer 1302 that is on the first side of the trench 106, and a portion of the first upper dielectric layer 1302 that is on the second side of the trench 106. As a result, the patterning forms a first contact opening 1704 on the first side of the trench 106 and a second contact opening 1706 on the second side of the trench 106.

The patterning uncovers sidewalls of the odd numbered electrodes 112, 120 on the first side of the trench 106 and sidewalls of the even numbered electrodes 116, 124 on the second side of the trench 106. In other words, the first contact opening 1704 is in communication with sidewalls of the odd numbered electrodes 112, 120 and the second contact opening 1706 is in communication with sidewalls of the even numbered electrodes 116, 124. In some embodiments, the first contact opening 1704 and the second contact opening 1706 extend to an upper surface of the dielectric structure 108.

In some embodiments, the patterning comprises a dry etching process or some other suitable process. In some embodiments, the masking layer 1702 comprises a photoresist mask, a hard mask, some other suitable mask, or any combination of the foregoing. In some embodiments, the masking layer 1702 is removed after the patterning.

In some embodiments, the etching is self-aligned to the sidewalls of the electrodes 112, 116, 120, 124. For example, the etching may have a high selectivity to the second upper dielectric layer 1602 and the first upper dielectric layer 1302 versus the ESL 138 so that the etching removes the second upper dielectric layer 1602 and the first upper dielectric layer 1302 from along the sidewalls of the electrodes 112, 116, 120, 124 and from over portions of the electrodes 112, 116, 120, 124 without removing the ESL 138 from over the electrodes 112, 116, 120, 124. Thus, by forming the masking layer 1702 over the second upper dielectric layer 1602 so that the gaps in the masking layer 1702 extend from over the ESL 138 to beyond the sidewalls of the electrodes 112, 116, 120, 124, the openings 1704, 1706 formed from the etching may be self-aligned to the sidewalls of the electrodes 112, 116, 120, 124. As a result, the etching may uncover the sidewalls of the electrodes 112, 116, 120, 124 even if there is some variation in the positioning of the masking layer 1702.

In some embodiments, a depth of the etching may be controlled by controlling a time duration of the etching. For example, the etching may be applied for a set amount of time that corresponds to a desired etch depth.

Figure 18:
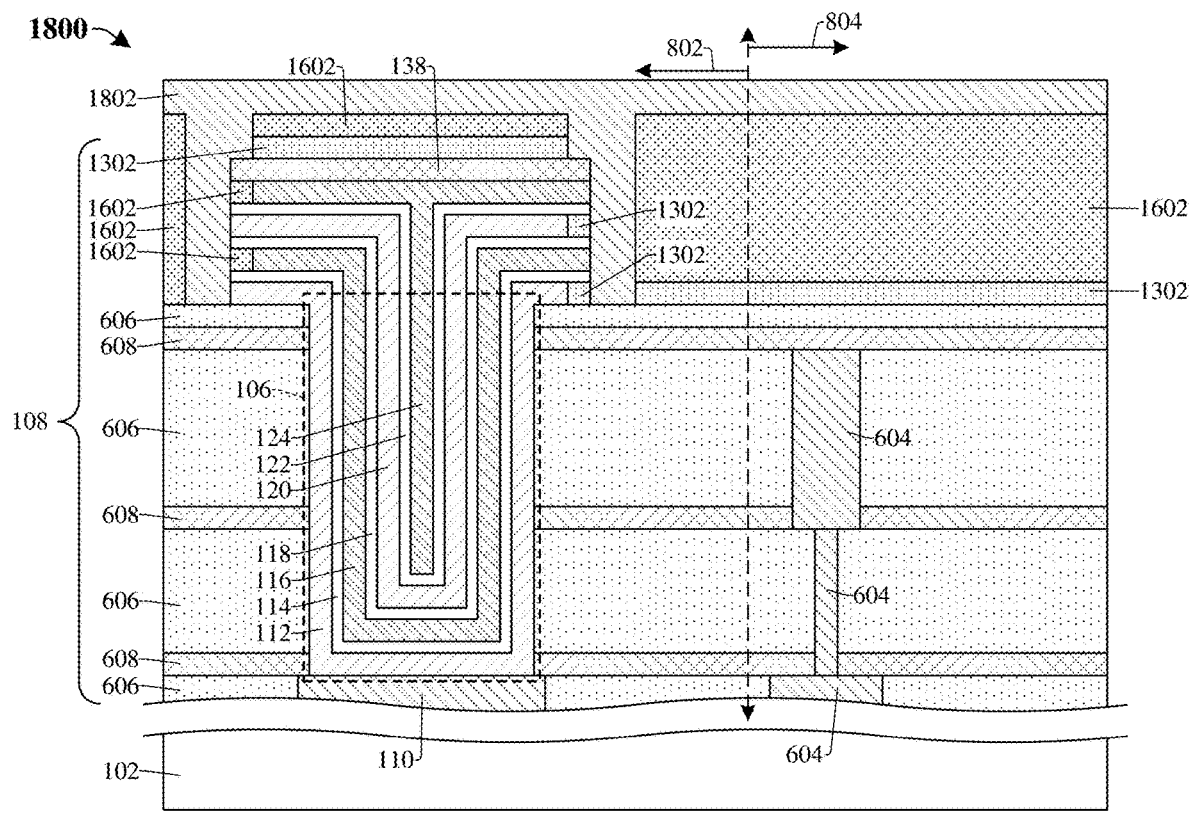

As shown in cross-sectional view 1800 of FIG. 18, a contact layer 1802 is deposited over the dielectric structure 108, in the first contact opening (1704 of FIG. 17), and in the second contact opening (1706 of FIG. 17). The contact layer 1802 fills the first and second contact openings. In some embodies, the contact layer 1802 comprises tungsten or some other suitable material and is deposited by a CVD process, a PVD process, an ALD process, a sputtering process, an ELD process, an ECD process, or some other suitable process.

Figure 19:
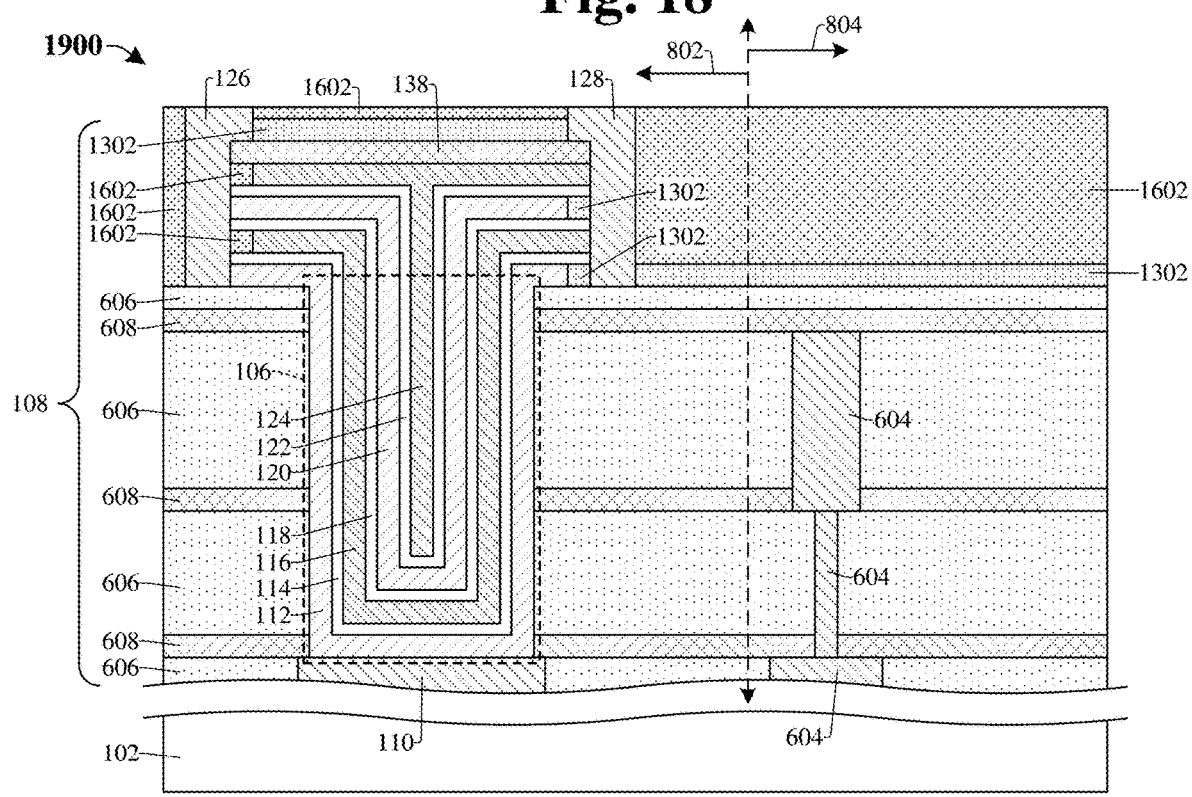

As shown in cross-sectional view 1900 of FIG. 19, a planarization process is performed on an upper surface of the contact layer (1802 of FIG. 18). The planarization process removes the contact layer from an upper surface of the second upper dielectric layer 1602 and forms a first contact 126 and a separate second contact 128 from the contact layer. In some embodiments, the planarization process is also performed on the second upper dielectric layer 1602. For example, the planarization process may thin the second upper dielectric layer 1602. In some embodiments, the planarization process comprises a chemical mechanical planarization (CMP) or some other suitable planarization process.

Figure 20:
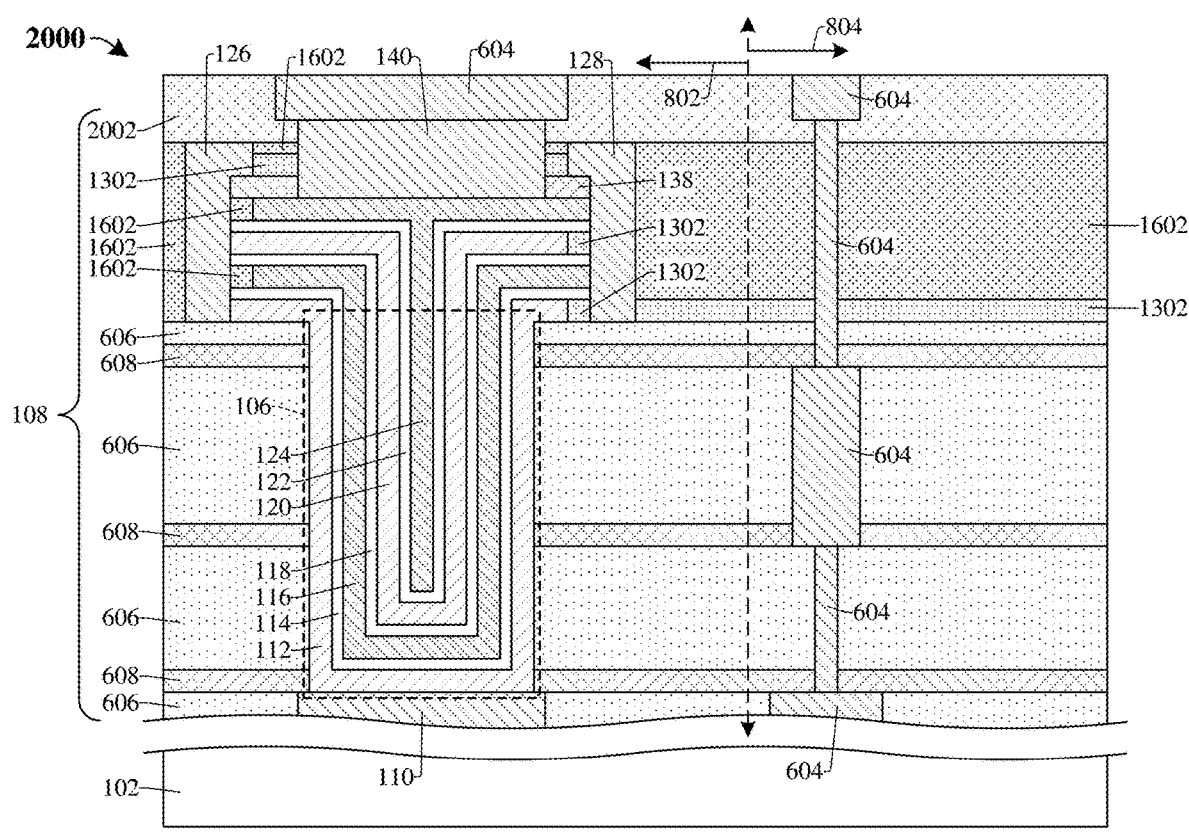

As shown in cross-sectional view 2000 of FIG. 20, a third upper dielectric layer 2002 is deposited over the second upper dielectric layer 1602, the first contact 126, and the second contact 128. In some embodiments, the third upper dielectric layer 2002 is considered part of the dielectric structure 108. In some embodiments, the third upper dielectric layer 2002 comprises silicon dioxide or some other suitable material and is deposited by a CVD process, a PVD process, an ALD process, or some other suitable process.

Further, an upper conductive wire 140 is formed over the fourth electrode 124. For example, the third upper dielectric layer 2002 is patterned (not shown) to form and upper conductive wire opening (not shown) that uncovers an upper surface of the fourth electrode 124. A conductive material is then deposited in the upper conductive wire opening to form an upper conductive wire 140 over the fourth electrode 124.

Furthermore, in some embodiments, one or more conductive wires 604 may be deposited over the upper conductive wire 140. In addition, one or more conductive wires 604 may be formed in the dielectric structure 108 on the logic side 804 of the dielectric structure 108 by way of one or more patterning and deposition processes.

Although the method of forming the trench capacitor illustrated in the FIGS. 8-20 includes forming four electrodes, it will be appreciated that in some other embodiments, the method may alternatively include forming the trench capacitor with a different number of electrodes (e.g., six electrodes, eight electrodes, etc.) without necessitating additional masking layers or additional trenches. Thus, a capacitance of the trench capacitor may be further increased without adding expenses or processing times that may be associated with using additional masking layers or forming additional trenches.

Figure 21:
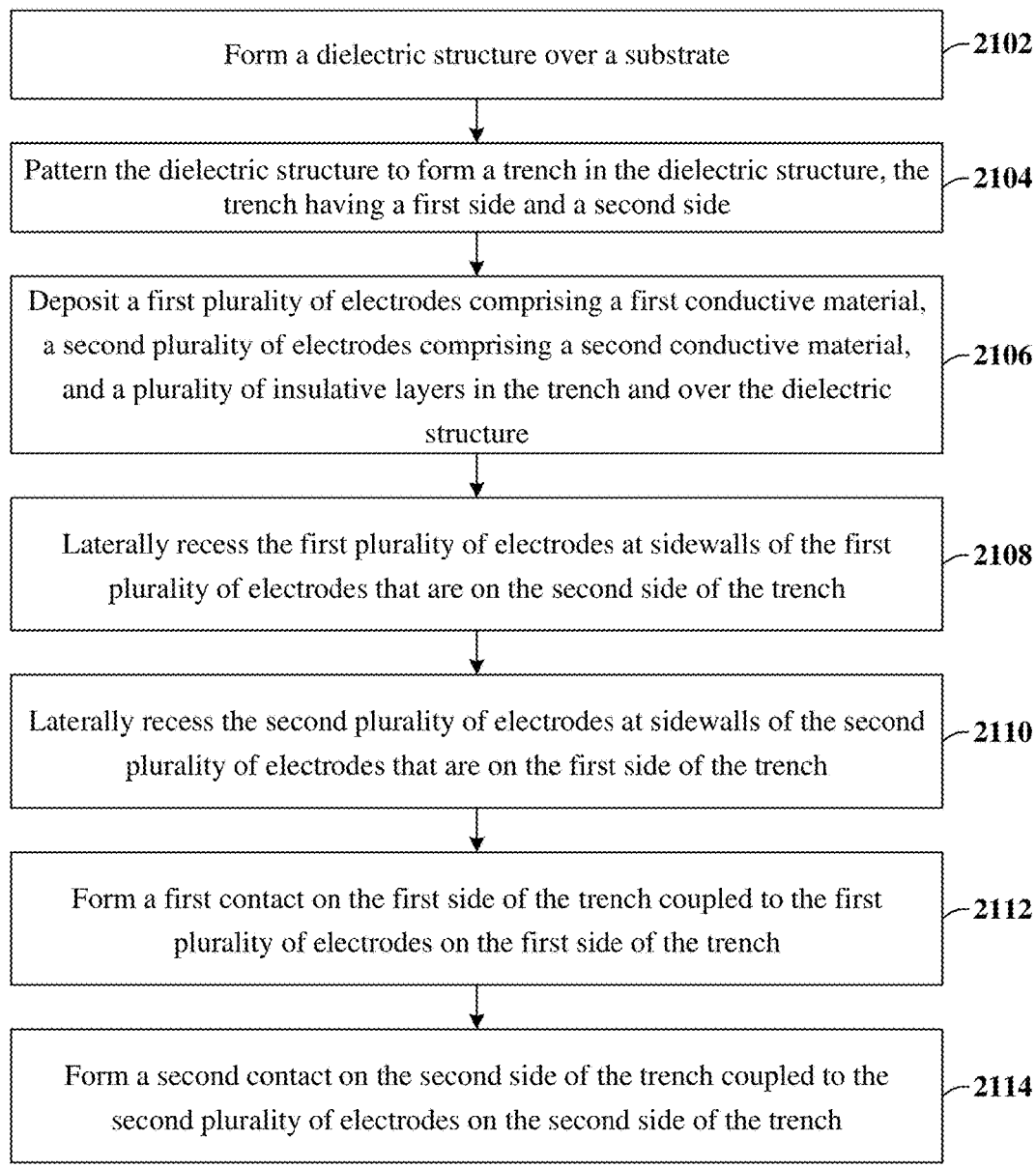
FIG. 21 illustrates a flow diagram of some embodiments of a method for forming an integrated chip comprising a trench capacitor, the trench capacitor comprising a plurality of electrodes in a trench.

FIG. 21 illustrates a flow diagram of some embodiments of a method 2100 for forming an integrated chip comprising a trench capacitor, the trench capacitor comprising a plurality of electrodes in a trench. While method 2100 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2102, form a dielectric structure over a substrate. FIG. 8 illustrates a cross-sectional view 800 of some embodiments corresponding to block 2102.

At 2104, pattern the dielectric structure to form a trench in the dielectric structure. The trench has a first side and a second side opposite the first side. FIG. 9 illustrates a cross-sectional view 900 of some embodiments corresponding to block 2104.

At 2106, deposit a first plurality of electrodes comprising a first conductive material, a second plurality of electrodes comprising a second conductive material, and a plurality of insulative layers in the trench and over the dielectric structure. The electrodes and insulative layers are deposited in an electrode-insulator-electrode-insulator type of alternating fashion. For example, a first electrode of the first plurality is deposited in the trench, a first insulative layer is deposited in the trench and over the first electrode of the first plurality, a first electrode of the second plurality is deposited in the trench and over the first insulative layer, a second insulative is deposited in the trench and over the first electrode of the second plurality, a second electrode of the first plurality is deposited in the trench and over the second insulative layer, and so on. The electrodes form a plurality (e.g., three of more) of capacitors in the trench. FIG. 10 illustrates a cross-sectional view 1000 of some embodiments corresponding to block 2106.

At 2108, laterally recess the first plurality of electrodes at sidewalls of the first plurality of electrodes that are on the second side of the trench. For example, the first plurality of electrodes are laterally recessed with a first wet etching process that is selective to the first conductive material of the first plurality of electrodes. FIG. 12 illustrates a cross-sectional view 1200 of some embodiments corresponding to block 2108.

At 2110, laterally recess the second plurality of electrodes at sidewalls of the second plurality of electrodes that are on the first side of the trench. For example, the second plurality of electrodes are laterally recessed with a second wet etching process that is selective to the second conductive material of the second plurality of electrodes. FIG. 15 illustrates a cross-sectional view 1500 of some embodiments corresponding to block 2110.

At 2112, form a first contact on the first side of the trench coupled to the first plurality of electrodes on the first side of the trench. The first contact is separated from the second plurality of electrodes. FIGS. 17-19 illustrate cross-sectional views 1700-1900 of some embodiments corresponding to block 2112.

At 2114, form a second contact on the second side of the trench coupled to the second plurality of electrodes on the second side of the trench. The second contact is separated from the first plurality of electrodes. The first contact and the second contact couple the capacitors in parallel. FIGS. 17-19 illustrate cross-sectional views 1700-1900 of some embodiments corresponding to block 2114.

Thus, the present disclosure relates to an integrated chip and a method for forming the integrated chip, the integrated chip comprising a plurality of parallelly coupled capacitors disposed in a single trench for increasing a capacitance of the integrated chip without increasing a pitch of the integrated chip.

Accordingly, in some embodiments, the present disclosure relates to an integrated chip comprising a dielectric structure over a substrate. A first capacitor is disposed between sidewalls of the dielectric structure. The first capacitor includes a first electrode between the sidewalls of the dielectric structure, a second electrode between the sidewalls of the dielectric structure and over the first electrode, and a first insulative layer between the first electrode and the second electrode. A second capacitor is disposed between the sidewalls of the dielectric structure. The second capacitor includes the second electrode, a third electrode between the sidewalls of the dielectric structure and over the second electrode, and a second insulative layer between the second electrode and the third electrode. A third capacitor is disposed between the sidewalls of the dielectric structure. The third capacitor includes the third electrode, a fourth electrode between the sidewalls of the dielectric structure and over the third electrode, and a third insulative layer between the third electrode and the fourth electrode. The first capacitor, the second capacitor, and the third capacitor are coupled in parallel by a first contact arranged on a first side of the first capacitor and a second contact arranged on a second side of the first capacitor, opposite the first side.

In other embodiments, the present disclosure relates to an integrated chip comprising a substrate and a dielectric structure over the substrate. A lower conductive wire is in the dielectric structure. An upper surface of the lower conductive wire and sidewalls of the dielectric structure delimit a trench in the dielectric structure. A first electrode is in the trench. The first electrode lines the sidewalls of the dielectric structure and the upper surface of the lower conductive wire. The first electrode comprises a first conductive material. A first insulative layer is in the trench. The first insulative layer lines sidewalls and an upper surface of the first electrode. A second electrode is in the trench. The second electrode lines sidewalls and an upper surface of the first insulative layer. The second electrode comprises a second conductive material different from the first conductive material. A second insulative layer is in the trench. The second insulative layer lines sidewalls and an upper surface of the second electrode. A third electrode is in the trench. The third electrode lines sidewalls and an upper surface of the second insulative layer. The third electrode comprises the first conductive material. A third insulative layer is in the trench. The third insulative layer lines sidewalls and an upper surface of the third electrode. A fourth electrode is in the trench. The fourth electrode lines sidewalls and an upper surface of the third insulative layer. The fourth electrode comprises the second conductive material. A first contact is arranged on a first side of the first electrode, the second electrode, the third electrode, and the fourth electrode. The first contact couples the first electrode to the third electrode. A second contact is arranged on a second side of the first electrode, the second electrode, the third electrode, and the fourth electrode, opposite the first side. The second contact couples the second electrode to the fourth electrode.

In yet other embodiments, the present disclosure relates to a method for forming an integrated chip. The method comprises forming a dielectric structure over a substrate. The dielectric structure is patterned to form a trench in the dielectric structure. The trench has a first side and a second side opposite the first side. A first electrode comprising a first conductive material is deposited in the trench and over the dielectric structure. A first insulative layer is deposited in the trench and over the first electrode. A second electrode comprising a second conductive material, different from the first conductive material, is deposited in the trench and over the first insulative layer. A second insulative layer is deposited in the trench and over the second electrode. A third electrode comprising the first conductive material is deposited in the trench and over the second insulative layer. A third insulative layer is deposited in the trench and over the third electrode. A fourth electrode comprising the second conductive material is deposited in the trench and over the third insulative layer. The first electrode and the third electrode are laterally recessed at sidewalls of the first electrode and the third electrode that are on the second side of the trench with a first etching process. The second electrode and the fourth electrode are laterally recessed at sidewalls of the second electrode and the fourth electrode that are on the first side of the trench with a second etching process different from the first etching process. A first contact is formed on the first side of the trench. The first contact is coupled to the first electrode and the third electrode. A second contact is formed on the second side of the trench. The second contact is coupled to the second electrode and the fourth electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
   a dielectric structure over a substrate;
   a lower conductive wire within the dielectric structure;
   a first capacitor disposed between sidewalls of the dielectric structure and over the lower conductive wire, wherein the first capacitor includes a first electrode between the sidewalls of the dielectric structure, a second electrode between the sidewalls of the dielectric structure and over the first electrode, and a first insulative layer between the first electrode and the second electrode;
   a second capacitor disposed between the sidewalls of the dielectric structure, wherein the second capacitor includes the second electrode, a third electrode between the sidewalls of the dielectric structure and over the second electrode, and a second insulative layer between the second electrode and the third electrode;
   a third capacitor disposed between the sidewalls of the dielectric structure, wherein the third capacitor includes the third electrode, a fourth electrode between the sidewalls of the dielectric structure and over the third electrode, and a third insulative layer between the third electrode and the fourth electrode; and
   an upper conductive wire over the fourth electrode,
   wherein the first capacitor, the second capacitor, and the third capacitor are coupled in parallel by a first contact arranged on a first side of the first capacitor and a second contact arranged on a second side of the first capacitor, opposite the first side,
   wherein the first electrode and the third electrode are electrically coupled to the lower conductive wire and electrically isolated from the upper conductive wire, and wherein the second electrode and the fourth electrode are electrically coupled to the upper conductive wire and electrically isolated from the lower conductive wire.

2. The integrated chip of claim 1, wherein the first contact is coupled to the first electrode and the third electrode, and wherein the second contact is coupled to the second electrode and the fourth electrode.

3. The integrated chip of claim 1, wherein a sidewall of the first contact extends along a first sidewall of the first electrode and a first sidewall of the third electrode, and wherein a sidewall of the second contact extends along a first sidewall of the second electrode and a first sidewall of the fourth electrode.

4. The integrated chip of claim 3, wherein a second sidewall of the first electrode, opposite the first sidewall of the first electrode, is spaced apart and electrically isolated from the second contact by a first dielectric spacer, and wherein a second sidewall of the second electrode, opposite the first sidewall of the second electrode, is spaced apart and electrically isolated from the first contact by a second dielectric spacer.

5. The integrated chip of claim 4, wherein the first dielectric spacer extends from the second sidewall of the first electrode to the sidewall of the second contact, and from an upper surface of the dielectric structure to a lower surface of the first insulative layer.

6. The integrated chip of claim 4, wherein the second dielectric spacer extends from the second sidewall of the second electrode to the sidewall of the first contact, and from an upper surface of the first insulative layer to a lower surface of the second insulative layer.

7. The integrated chip of claim 3, wherein a second sidewall of the first electrode, opposite the first sidewall of the first electrode, is spaced apart and electrically isolated from the second contact by a first cavity, wherein a second sidewall of the second electrode, opposite the first sidewall of the second electrode, is spaced apart and electrically isolated from the first contact by a second cavity.

8. The integrated chip of claim 7, wherein the first cavity is delimited by the second sidewall of the first electrode, the sidewall of the second contact, an upper surface of the dielectric structure, and a lower surface of the first insulative layer, and wherein the second cavity is delimited by the second sidewall of the second electrode, the sidewall of the first contact, an upper surface of the first insulative layer, and a lower surface of the second insulative layer.

9. The integrated chip of claim 1, wherein the first contact extends along a sidewall of the first electrode, along a sidewall of the first insulative layer, along a sidewall of the second insulative layer, along a sidewall of the third electrode, and along a sidewall of the third insulative layer.

10. The integrated chip of claim 9, wherein the first contact further extends directly over the first electrode, the first insulative layer, the second insulative layer, the third electrode, and the third insulative layer.

11. The integrated chip of claim 1, wherein the first electrode and the third electrode comprise a first conductive material, and wherein the second electrode and the fourth electrode comprise a second conductive material different from the first conductive material.

12. An integrated chip, comprising:
a substrate;
a dielectric structure over the substrate;
a lower conductive wire in the dielectric structure, wherein an upper surface of the lower conductive wire and sidewalls of the dielectric structure delimit a trench in the dielectric structure;
a first electrode in the trench, wherein the first electrode lines the sidewalls of the dielectric structure and the upper surface of the lower conductive wire, and wherein the first electrode comprises a first conductive material;
a first insulative layer in the trench, wherein the first insulative layer lines sidewalls and an upper surface of the first electrode;
a second electrode in the trench, wherein the second electrode lines sidewalls and an upper surface of the first insulative layer, and wherein the second electrode comprises a second conductive material different from the first conductive material;
a second insulative layer in the trench, wherein the second insulative layer lines sidewalls and an upper surface of the second electrode;
a third electrode in the trench, wherein the third electrode lines sidewalls and an upper surface of the second insulative layer, and wherein the third electrode comprises the first conductive material;
a third insulative layer in the trench, wherein the third insulative layer lines sidewalls and an upper surface of the third electrode;
a fourth electrode in the trench, wherein the fourth electrode lines sidewalls and an upper surface of the third insulative layer, and wherein the fourth electrode comprises the second conductive material;
a first contact arranged on a first side of the first electrode, the second electrode, the third electrode, and the fourth electrode, wherein the first contact couples the first electrode to the third electrode; and
a second contact arranged on a second side of the first electrode, the second electrode, the third electrode, and the fourth electrode, opposite the first side, wherein the second contact couples the second electrode to the fourth electrode,
wherein a width of the lower conductive wire is greater than a distance between the sidewalls of the dielectric structure.

13. The integrated chip of claim 12, further comprising:
an upper conductive wire on a top surface of the fourth electrode,
wherein the first electrode and the third electrode are coupled to the lower conductive wire and electrically isolated from the upper conductive wire, and wherein the second electrode and the fourth electrode are coupled to the upper conductive wire and electrically isolated from the lower conductive wire.

14. The integrated chip of claim 12, wherein the first electrode has a first sidewall that is coupled to the first contact and a second sidewall that is separated from the second contact by a first dielectric spacer, and wherein the second electrode has a first sidewall that is coupled to the second contact and a second sidewall that is separated from the first contact by a second dielectric spacer.

15. The integrated chip of claim 12, further comprising:
an etch stop layer on an upper surface of the fourth electrode, wherein the etch stop layer is over a first sidewall of the fourth electrode and a second sidewall of the fourth electrode.

16. The integrated chip of claim 12, wherein the lower conductive wire is electrically coupled to the first electrode and the third electrode, and wherein the lower conductive wire is electrically isolated from the second electrode and the fourth electrode.

17. A method for forming an integrated chip, the method comprising:
forming a dielectric structure over a substrate;
patterning the dielectric structure to form a trench in the dielectric structure, the trench having a first side and a second side opposite the first side;

depositing a first electrode comprising a first conductive material in the trench and over the dielectric structure;

depositing a first insulative layer in the trench and over the first electrode;

depositing a second electrode comprising a second conductive material, different from the first conductive material, in the trench and over the first insulative layer;

depositing a second insulative layer in the trench and over the second electrode;

depositing a third electrode comprising the first conductive material in the trench and over the second insulative layer;

depositing a third insulative layer in the trench and over the third electrode;

depositing a fourth electrode comprising the second conductive material in the trench and over the third insulative layer;

laterally recessing the first electrode and the third electrode at sidewalls of the first electrode and the third electrode that are on the second side of the trench with a first etching process;

laterally recessing the second electrode and the fourth electrode at sidewalls of the second electrode and the fourth electrode that are on the first side of the trench with a second etching process different from the first etching process;

forming a first contact on the first side of the trench that is coupled to the first electrode and the third electrode; and forming a second contact on the second side of the trench that is coupled to the second electrode and the fourth electrode.

18. The method of claim 17, wherein the first etching process is substantially selective to the first conductive material versus the second conductive material, and wherein the second etching process is substantially selective to the second conductive material versus the first conductive material.

19. The method of claim 17, further comprising:

patterning the first electrode, the second electrode, the third electrode, and the fourth electrode on the first side of the trench after laterally recessing the first electrode and the third electrode and before laterally recessing the second electrode and the fourth electrode.

20. The method of claim 17, further comprising:

depositing a first upper dielectric layer along the sidewalls of the first electrode and the third electrode that are on the second side of the trench after laterally recessing the first electrode and the third electrode; and depositing a second upper dielectric layer along the sidewalls of the second electrode and the fourth electrode that are on the first side of the trench after laterally recessing the second electrode and the fourth electrode.

* * * * *